United States Patent
Morishita

(10) Patent No.: US 11,532,781 B2
(45) Date of Patent: Dec. 20, 2022

(54) PIEZOELECTRIC THIN FILM, PIEZOELECTRIC THIN FILM DEVICE, PIEZOELECTRIC ACTUATOR, PIEZOELECTRIC SENSOR, PIEZOELECTRIC TRANSDUCER, HARD DISK DRIVE, PRINTER HEAD, AND INK JET PRINTER DEVICE

(71) Applicant: TDK Corporation, Tokyo (JP)

(72) Inventor: Junpei Morishita, Tokyo (JP)

(73) Assignee: TDK Corporation, Tokyo (JP)

( * ) Notice: Subject to any disclaimer, the term of this patent is extended or adjusted under 35 U.S.C. 154(b) by 399 days.

(21) Appl. No.: 16/733,460

(22) Filed: Jan. 3, 2020

(65) Prior Publication Data
US 2020/0227621 A1    Jul. 16, 2020

(30) Foreign Application Priority Data
Jan. 11, 2019   (JP) .............................. JP2019-003739

(51) Int. Cl.
*H01L 41/18*   (2006.01)
*H01L 41/187*  (2006.01)
(Continued)

(52) U.S. Cl.
CPC ...... *H01L 41/1878* (2013.01); *B41J 2/14233* (2013.01); *C04B 35/26* (2013.01); *C04B 35/475* (2013.01); *C04B 35/62218* (2013.01); *H01L 41/0477* (2013.01); *H01L 41/0815* (2013.01); *H01L 41/0973* (2013.01); *H01L 41/1132* (2013.01); *B41J 2002/14266* (2013.01); *C04B 2235/3236* (2013.01); *C04B 2235/3274* (2013.01); *C04B 2235/3298* (2013.01); *C04B 2235/667* (2013.01); *C04B 2235/95* (2013.01);
(Continued)

(58) Field of Classification Search
None
See application file for complete search history.

(56) References Cited

U.S. PATENT DOCUMENTS

2009/0230211 A1    9/2009 Kobayashi et al.
2009/0273257 A1 *  11/2009 Ifuku .................. H01L 41/1875
                                                           347/68
(Continued)

FOREIGN PATENT DOCUMENTS

JP    2010-043353 A     2/2010
JP    2016-027593 A     2/2016
WO    WO-2013175740 A1 * 11/2013 ........... A61B 8/4494

OTHER PUBLICATIONS

Guo, Yiping et al., "Thickness Dependence of Electrical Properties of Highly (100)-Oriented BaTiO₃ Thin Films Prepared by One-Step Chemical Solution Deposition," Japanese Journal of Applied Physics, vol. 45, No. 2A, 2006, pp. 855-859.

*Primary Examiner* — Erica S Lin
(74) *Attorney, Agent, or Firm* — Faegre Drinker Biddle & Reath LLP

(57) ABSTRACT

A piezoelectric thin film 3 contains a metal oxide, the metal oxide contains bismuth, potassium, titanium, iron and element M, the element M is at least one of magnesium and nickel, at least a part of the metal oxide is a crystal having a perovskite structure, and a (001) plane, a (110) plane or a (111) plane of the crystal is oriented in a normal direction dn of the surface of the piezoelectric thin film 3.

17 Claims, 13 Drawing Sheets

(51) Int. Cl.
    *H01L 41/08*     (2006.01)
    *H01L 41/09*     (2006.01)
    *H01L 41/113*     (2006.01)
    *C04B 35/26*     (2006.01)
    *C04B 35/475*     (2006.01)
    *C04B 35/622*     (2006.01)
    *B41J 2/14*     (2006.01)
    *H01L 41/047*     (2006.01)
    *G01C 19/5621*     (2012.01)
    *G01L 9/08*     (2006.01)
    *G01H 11/08*     (2006.01)
    *G11B 5/48*     (2006.01)

(52) U.S. Cl.
    CPC ......... *G01C 19/5621* (2013.01); *G01H 11/08* (2013.01); *G01L 9/08* (2013.01); *G11B 5/4873* (2013.01)

(56) References Cited

U.S. PATENT DOCUMENTS

| | | |
|---|---|---|
| 2011/0006243 A1 | 1/2011 | Sasaki et al. |
| 2015/0085023 A1 | 3/2015 | Sakai |
| 2015/0141834 A1 | 5/2015 | Minemoto et al. |
| 2015/0364675 A1* | 12/2015 | Wang ................ H01L 41/1871 347/68 |
| 2017/0040523 A1* | 2/2017 | Sakai ................ B41J 2/14201 |

* cited by examiner

PIEZOELECTRIC THIN FILM, PIEZOELECTRIC THIN FILM DEVICE, PIEZOELECTRIC ACTUATOR, PIEZOELECTRIC SENSOR, PIEZOELECTRIC TRANSDUCER, HARD DISK DRIVE, PRINTER HEAD, AND INK JET PRINTER DEVICE

TECHNICAL FIELD

The present invention relates to a piezoelectric thin film, a piezoelectric thin film device, a piezoelectric actuator, a piezoelectric sensor, a piezoelectric transducer, a hard disk drive, a printer head, and an ink jet printer device.

BACKGROUND

A piezoelectric material is processed into various piezoelectric devices depending on a variety of purposes. For example, a piezoelectric actuator converts voltage into force by the inverse piezoelectric effect which deforms a piezoelectric material under voltage application to the piezoelectric material. Also, a piezoelectric sensor converts force into voltage by the piezoelectric effect which deforms a piezoelectric material under pressure application to the piezoelectric material. These piezoelectric devices are installed on various electronic equipment. In the recent market, size reduction and performance improvement of electronic equipment are required, so that piezoelectric devices (piezoelectric thin film devices) using a piezoelectric thin film have been actively studied. However, the thinner the thickness of a piezoelectric material is, more difficult it is to obtain the piezoelectric effect and the inverse piezoelectric effect, so that development of a piezoelectric material having excellent piezoelectricity in a thin film state is expected.

Conventionally, lead zirconate titanate (so-called PZT), i.e., a perovskite ferroelectric material, has been widely used as a piezoelectric material. However, since PZT contains lead which is harmful for a human body and environment, development of a lead-free piezoelectric material is expected to replace PZT. For example, in Non Patent Literature 1 described below, $BaTiO_3$ type materials are described as an example of lead-free piezoelectric materials. $BaTiO_3$ type materials have relatively excellent piezoelectricity among lead-free piezoelectric materials and application to piezoelectric thin film devices is particularly expected.

[Non Patent Literature 1]

Yiping Guo et al., Thickness Dependence of Electrical Properties of Highly (100)-Oriented $BaTiO_3$ Thin Films Prepared by One-Step Chemical Solution Deposition, Japanese Journal of Applied Physics, Vol. 45, No. 2A, 2006, pp. 855-859

SUMMARY

An object of the present invention is to provide a piezoelectric thin film having excellent piezoelectricity, a piezoelectric thin film device, and a piezoelectric actuator, a piezoelectric sensor, a piezoelectric transducer, a hard disk drive, a printer head, and an ink jet printer device using the piezoelectric thin film device.

The piezoelectric thin film according to an aspect of the present invention is a piezoelectric thin film containing a metal oxide, wherein the metal oxide contains bismuth, potassium, titanium, iron and element M, the element M is at least one of magnesium and nickel, at least a part of the metal oxide is a crystal having a perovskite structure, and a (001) plane, a (110) (110) plane or a (111) (111) plane of the crystal is oriented in a normal direction of the surface of the piezoelectric thin film.

The metal oxide may be represented by the following chemical formula 1:

$$x(Bi_\alpha K_{1-\alpha})TiO_3 \text{-} yBi(M_\beta Ti_{1-\beta})O_3 \text{-} zBiFeO_3 \qquad (1)$$

wherein each of x, y and z in the chemical formula 1 may be a positive real number; x+y+z may be 1; α in the chemical formula 1 may be more than 0 and less than 1; β in the chemical formula 1 may be more than 0 and less than 1; M in the chemical formula 1 may be represented by $Mg_\gamma Ni_{1-\gamma}$; and γ may be 0 or more and 1 or less.

A three-dimensional coordinate system may be composed of an x-axis, a y-axis and a z-axis; any coordinates in the coordinate system may be represented by (X, Y, Z); coordinates (x, y, z) in the coordinate system may correspond to x, y and z in the chemical formula 1; coordinates A in the coordinate system may be (0.300, 0.100, 0.600), coordinates B in the coordinate system may be (0.450, 0.250, 0.300), a coordinates C in the coordinate system may be (0.200, 0.500, 0.300), a coordinates D in the coordinate system may be (0.100, 0.300, 0.600), and (x, y, z) may be positioned within a quadrangle with vertexes at the coordinates A, coordinates B, coordinates C, and coordinates D.

Coordinates E in the coordinate system may be (0.400, 0.200, 0.400), coordinates F in the coordinate system may be (0.200, 0.400, 0.400), and the coordinates (x, y, z) may be positioned within a quadrangle with vertexes at the coordinates A, coordinates E, coordinates F, and coordinates D.

The piezoelectric thin film may be an epitaxial film.

At least a part of the crystal may be tetragonal crystal.

The piezoelectric thin film may be a ferroelectric thin film.

The piezoelectric thin film device according to an aspect of the present invention comprises the piezoelectric thin film described above.

The piezoelectric thin film device may comprise a single crystal substrate and the piezoelectric thin film stacked on the single crystal substrate.

The piezoelectric thin film device may comprise a single crystal substrate, an electrode layer stacked on the single crystal substrate, and the piezoelectric thin film stacked on the electrode layer.

The piezoelectric thin film device may comprise an electrode layer and the piezoelectric thin film stacked on the electrode layer.

The piezoelectric thin film device may further comprise at least one intermediate layer, and the intermediate layer may be disposed between the single crystal substrate and the electrode layer.

The piezoelectric thin film device may further comprise at least one intermediate layer, and the intermediate layer may be disposed between the electrode layer and the piezoelectric thin film.

The electrode layer may contain a platinum crystal, wherein the (002) plane of the platinum crystal may be oriented in a normal direction of the surface of the electrode layer, and the (200) plane of the platinum crystal may be oriented in an in-plane direction of the surface of the electrode layer.

The piezoelectric actuator according to an aspect of the present invention comprises the piezoelectric thin film device described above.

The piezoelectric sensor according to an aspect of the present invention comprises the piezoelectric thin film device described above.

The piezoelectric transducer according to an aspect of the present invention comprises the piezoelectric thin film device described above.

The hard disk drive according to an aspect of the present invention comprises a head stack assembly, wherein the head stack assembly comprises a head assembly, and the head assembly comprises the piezoelectric actuator described above.

The printer head according to an aspect of the present invention comprises the piezoelectric actuator described above.

The ink jet printer device according to an aspect of the present invention comprises the printer head described above.

According to the present invention, a piezoelectric thin film having excellent piezoelectricity, a piezoelectric thin film device, and a piezoelectric actuator, a piezoelectric sensor, a piezoelectric transducer, a hard disk drive, a printer head, and an ink jet printer device using the piezoelectric thin film device are provided.

DETAILED DESCRIPTION

Figure 1A:
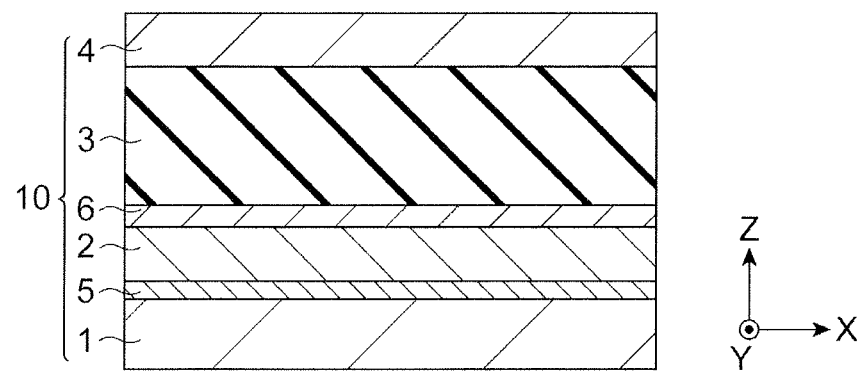
FIG. 1A is a schematic view of a piezoelectric thin film device according to an embodiment of the present invention and FIG. 1B is a perspective exploded view of the piezoelectric thin film device shown in FIG. 1A, and a first electrode layer, a first intermediate layer, a second intermediate layer and a second electrode layer are omitted in FIG. 1B.
Figure 1B:
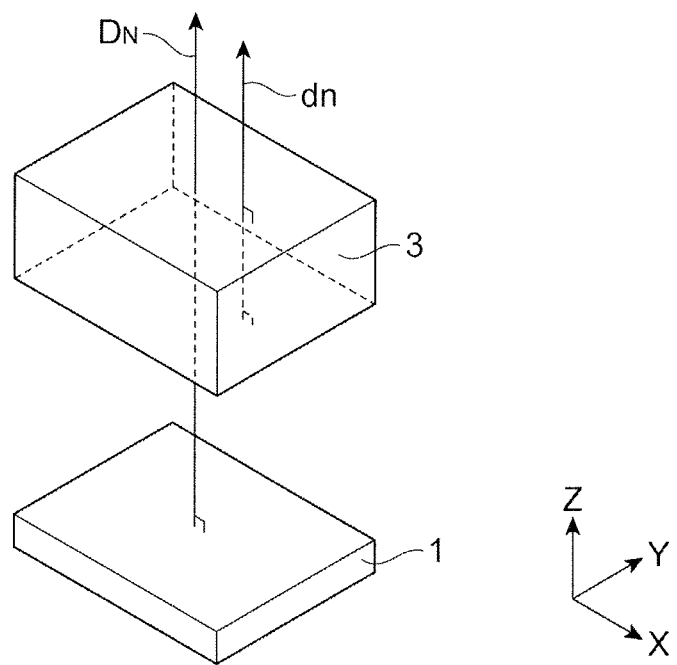

The details of one suitable embodiment of the present invention will be described with reference to drawings as follows. The present invention, however, is not limited to the following embodiments. In the drawings, the same symbols are given to the same or corresponding elements. The X-axis, Y-axis and Z-axis shown in FIG. 1A and FIG. 1B are three coordinate axes orthogonal to each other. The coordinate systems shown in FIG. 1A and FIG. 1B have nothing to do with the coordinate systems shown in FIG. 4 and FIG. 5.

(Piezoelectric Thin Film and Piezoelectric Thin Film Device)

The piezoelectric thin film device according to the present embodiment comprises a piezoelectric thin film. For example, as shown in FIG. 1A, a piezoelectric thin film device 10 according to the present embodiment may comprise a single crystal substrate 1, a first electrode layer 2 (lower electrode layer) stacked on the single crystal substrate 1, a piezoelectric thin film 3 stacked on the first electrode layer 2, and a second electrode layer 4 (upper electrode layer) stacked on the piezoelectric thin film 3. The piezoelectric thin film device 10 may comprise a first intermediate layer 5, the first intermediate layer 5 may be disposed between the single crystal substrate 1 and the first electrode layer 2, and the first electrode layer 2 may be stacked directly on the surface of the first intermediate layer 5. The piezoelectric thin film device 10 may comprise a second intermediate layer 6, the second intermediate layer 6 may be disposed between the first electrode layer 2 and the piezoelectric thin film 3, and the piezoelectric thin film 3 may be stacked directly on the surface of the second intermediate layer 6. The thickness of each of the single crystal substrate 1, the first intermediate layer 5, the first electrode layer 2, the second intermediate layer 6, the piezoelectric thin film 3, and the second electrode layer 4 may be uniform. As shown in FIG. 1B, the normal direction dn of the surface of the piezoelectric thin film 3 may be approximately parallel with the normal direction $D_N$ of the surface of the single crystal substrate 1.

A modified example of the piezoelectric thin film device 10 may comprise no single crystal substrate 1. For example, the single crystal substrate 1 may be removed after formation of the first electrode layer 2 and the piezoelectric thin film 3. A modified example of the piezoelectric thin film device 10 may comprise no second electrode layer 4. For example, after supply of a piezoelectric thin film device without a second electrode layer as a product to a manufacturer of electronic equipment, a second electrode layer may be added to the piezoelectric thin film device in a manufacturing process of the electronic equipment. In the case where the single crystal substrate 1 functions as electrode, a modified example of the piezoelectric thin film device 10 may comprise no first electrode layer 2. In other words, a modified example of the piezoelectric thin film device 10 may comprise a single crystal substrate 1 and a piezoelectric thin film 3 stacked on the single crystal substrate 1. The piezoelectric thin film 3 may be stacked directly on the single crystal substrate 1. The piezoelectric thin film 3 may be stacked on the single crystal substrate 1 through at least one intermediate layer of the first intermediate layer 5 and the second intermediate layer 6.

The piezoelectric thin film 3 contains a metal oxide. The metal oxide contains bismuth (Bi), potassium (K), titanium (Ti), iron (Fe) and an element M. The element M is at least one of magnesium (Mg) and nickel (Ni). The metal oxide is the main component of the piezoelectric thin film 3. The proportion of the metal oxide in the whole of the piezoelectric thin film 3 may be 99 mol % or more and 100 mol % or less. The piezoelectric thin film 3 may consist of the metal oxide only.

Figure 2:
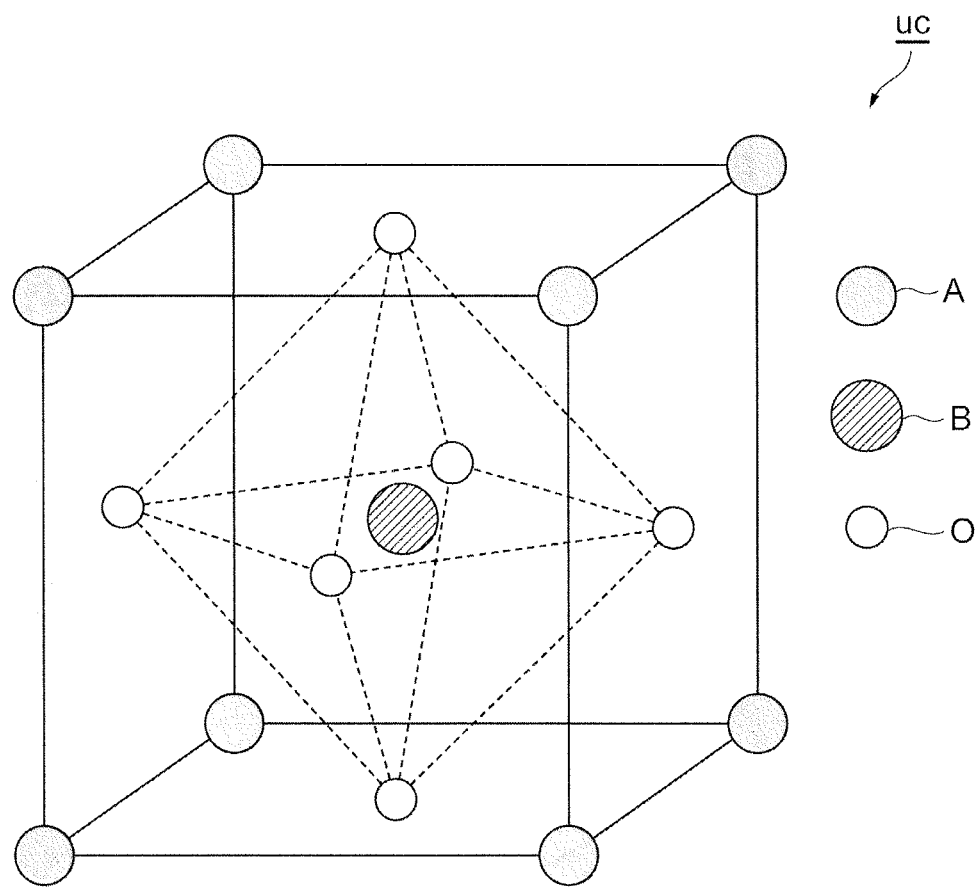
FIG. 2 is a perspective view of a unit cell of the perovskite structure.
Figure 3A:
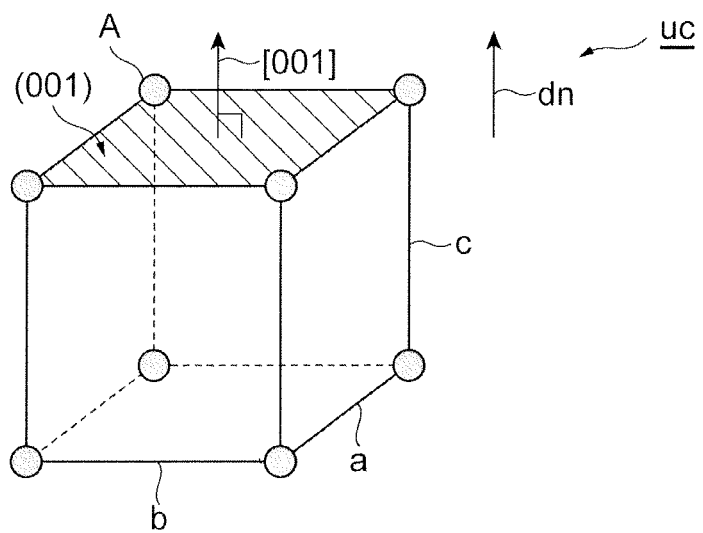
FIG. 3A is a perspective view of a unit cell of the perovskite structure, showing a (001) plane of the perovskite structure.
Figure 3B:
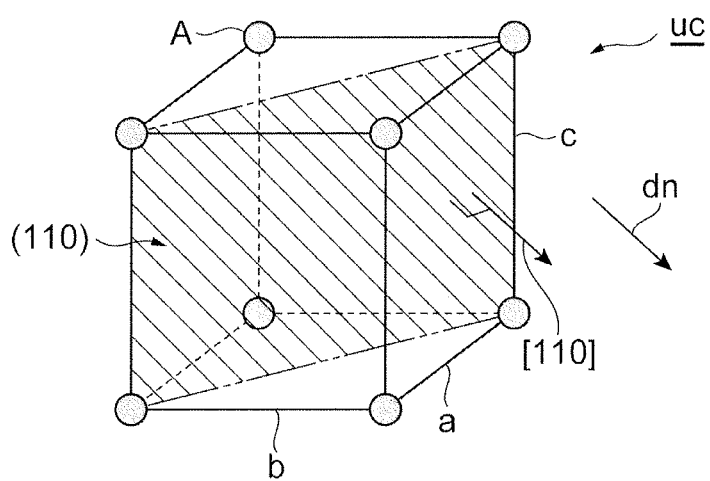
FIG. 3B is a perspective view of a unit cell of the perovskite structure, showing a (110) plane of the perovskite structure.
Figure 3C:
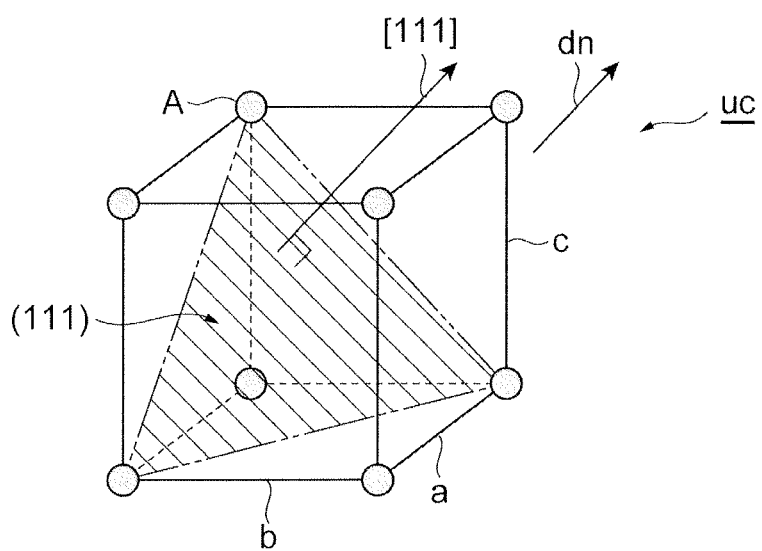
FIG. 3C is a perspective view of a unit cell of the perovskite structure, showing a (111) plane of the perovskite structure.

At least a part of the metal oxide is a crystal having a perovskite structure. The whole metal oxide may be a crystal having a perovskite structure. In the following, crystals having a perovskite structure are written as perovskite-type crystals. The unit cell of perovskite-type crystals is shown in FIG. 2. An element positioned at the A-site of a unit cell uc is Bi or K. An element positioned at the B-site of a unit cell uc is Ti, Mg, Ni or Fe. The unit cell uc shown in FIG. 2 is the same as the unit cell uc shown in FIG. 3A, FIG. 3B and FIG. 3C. In FIG. 3A, FIG. 3B and FIG. 3C, however, the B-site and oxygen (O) in the unit cell uc are omitted to show a crystal plane. A symbol a is a lattice constant corresponding to the distance between the (100) planes of a perovskite-type crystal. A symbol b is a lattice constant corresponding to the distance between the (010) (010) planes of a perovskite-type crystal. A symbol c is a lattice constant corresponding to the distance between the (001) planes of a perovskite-type crystal.

The (001) plane, the (110) plane, or the (111) plane of the perovskite-type crystal is oriented in the normal direction dn of the surface of the piezoelectric thin film 3. For example, as shown in FIG. 3A, the (001) (001) plane of a perovskite-type crystal may face the normal direction dn of the surface of a piezoelectric thin film 3. In other words, the [001] (orientation of crystal plane) of a perovskite-type crystal may be approximately in parallel with the normal direction dn of the surface of the piezoelectric thin film 3. As shown in FIG. 3B, the (110) plane of a perovskite-type crystal may face the normal direction dn of the surface of the piezoelectric thin film 3. In other words, the [110] (orientation of crystal plane) of a perovskite-type crystal may be approximately in parallel with the normal direction dn of the surface of the piezoelectric thin film 3. As shown in FIG. 3C, the (111) plane of a perovskite-type crystal may face the normal direction dn of the surface of the piezoelectric thin film 3. In other words, the [111] (orientation of crystal plane) of a perovskite-type crystal may be approximately in parallel with the normal direction dn of the surface of the piezoelectric thin film 3. The perovskite-type crystal can be polarized in [001], [110] or [111]. Accordingly, since the (001) plane, the (110) plane or the (111) plane is oriented in the normal direction dn of the surface of the piezoelectric thin film 3, the piezoelectric thin film 3 can have piezoelectricity. The crystal orientation described below means that the (001) plane, the (110) plane or the (111) plane of a perovskite-type crystal is oriented in the normal direction dn of the surface of the piezoelectric thin film 3.

The piezoelectric thin film 3 may contain a plurality of perovskite-type crystals, and the (001) planes of all of the perovskite-type crystals may be oriented in the normal direction dn of the surface of the piezoelectric thin film 3. The (110) planes of all of the perovskite-type crystals may be oriented in the normal direction dn of the surface of the piezoelectric thin film 3. The (111) planes of all of the perovskite-type crystals may be oriented in the normal direction dn of the surface of the piezoelectric thin film 3. The (001) planes of a part of the perovskite-type crystals may be oriented in the normal direction dn of the surface of the piezoelectric thin film 3, the (110) planes of another part of the perovskite-type crystals may be oriented in the normal direction dn of the surface of the piezoelectric thin film 3, and the (111) planes of another part of the perovskite-type crystals may be oriented in the normal direction dn of the surface of the piezoelectric thin film 3. The (001) planes of a part of the perovskite-type crystals may be oriented in the normal direction dn of the surface of the piezoelectric thin film 3, and the (110) planes of a remaining part of the perovskite-type crystals may be oriented in the normal direction dn of the surface of the piezoelectric thin film 3. The (110) planes of a part of the perovskite-type crystals may be oriented in the normal direction dn of the surface of the piezoelectric thin film 3, and the (111) planes of a remaining part of the perovskite-type crystals may be oriented in the normal direction dn of the surface of the piezoelectric thin film 3. The (001) planes of a part of the perovskite-type crystals may be oriented in the normal direction dn of the surface of the piezoelectric thin film 3, and the (111) planes of a remaining part of the perovskite-type crystals may be oriented in the normal direction dn of the surface of the piezoelectric thin film 3.

The degree of orientation of each of the crystal planes may be quantified by orientation degree. The orientation degree of each of the crystal planes may be calculated based on peaks of X-ray diffraction derived from each of the crystal planes. The peaks of X-ray diffraction derived from each of the crystal planes may be measured by out-of-plane measurement of the surface of the piezoelectric thin film 3. The orientation degree of the (001) plane may be represented by $100 \times I_{(001)}/\Sigma I_{(hkl)}$. The orientation degree of the (110) plane may be represented by $100 \times I_{(110)}/\Sigma I_{(hkl)}$. The orientation degree of the (111) plane may be represented by $100 \times I_{(111)}/\Sigma I_{(hkl)}$. $I_{(001)}$ is a maximum peak value of X-ray diffraction derived from the (001) plane. $I_{(110)}$ is a maximum peak value of X-ray diffraction derived from the (110) plane. $I_{(111)}$ is a maximum peak value of X-ray diffraction derived from the (111) plane. $\Sigma I_{(hkl)}$ is $I_{(001)}+I_{(110)}+I_{(111)}$. The orientation degree of the (001) plane may be represented by $100 \times S_{(001)}/\Sigma S_{(hkl)}$. The orientation degree of the (110) plane may be represented by $100 \times S_{(110)}/\Sigma S_{(hkl)}$. The orientation degree of the (111) plane may be represented by $100 \times S_{(111)}/\Sigma S_{(hkl)}$. $S_{(001)}$ is an area of the X-ray diffraction peak derived from the (001) plane (integration of the peak). $S_{(110)}$ is an area of the X-ray diffraction peak derived from the (110) plane (integration of the peak). $S_{(111)}$ is an area of X-ray diffraction peak derived from the (111) plane (integration of the peak). $\Sigma S_{(hkl)}$ is $S_{(001)}+S_{(110)}+S_{(111)}$. The degree of orientation of each of the crystal planes may be quantified by the orientation degree F. based on the Lotgering method. The higher the orientation degree of the crystal plane is, the larger the piezoelectric constant of a piezoelectric thin film is. Therefore, the orientation degree of a crystal plane may be 70% or more and 100% or less, preferably 80% or more and 100% or less, more preferably 90% or more and 100% or less.

Since the piezoelectric thin film 3 tends to have a large piezoelectric constant ($d_{33}$), it is preferable that the (001) plane of a perovskite-type crystal be preferentially oriented in the normal direction dn of the surface of the piezoelectric thin film 3. In other words, it is preferable that the orientation degree of the (001) plane be higher than the orientation degree of each of the (110) plane and the (111) plane.

The perovskite-type crystal may be at least one selected from the group consisting of a tetragonal crystal, a cubic crystal and a rhombohedral crystal at normal temperature or at a temperature of Curie temperature or less. It is preferable that at least a part of the perovskite-type crystals be tetragonal crystal. In other words, it is preferable that a be equal to b, and c/a be larger than 1.0. It is more preferable that all of the perovskite-type crystals be tetragonal crystal. Since an in-plane stress tends to be applied to the surface of the piezoelectric thin film 3, the piezoelectric thin film 3 tends to contract in the in-plane direction. As a result, the lattice constants a and b in the in-plane direction of the piezoelectric thin film 3 tend to be smaller than the lattice constant c in the normal direction dn of the surface of the piezoelectric thin film 3, so that the perovskite-type crystal tends to be a tetragonal crystal. With the perovskite-type crystal being a tetragonal crystal having the crystal orientation described above, the piezoelectric thin film 3 tends to have a large piezoelectric constant $d_{33}$.

It is preferable that the (001) plane of the tetragonal crystal be oriented in the normal direction dn of the surface of the piezoelectric thin film 3. Due to the in-plane stress described above, the lattice constant c in the normal direction dn of the surface of the piezoelectric thin film 3 tends to be larger than the lattice constants a and b in the in-plane direction. As a result, the piezoelectric thin film 3 tends to be polarized in the normal direction dn of the surface of the piezoelectric thin film 3, and the (001) plane of the tetragonal crystal tends to be oriented in the normal direction dn of the surface of the piezoelectric thin film 3. Due to the (001) plane of the tetragonal crystal being oriented in the normal direction dn of the surface of the piezoelectric thin film 3, the piezoelectric thin film 3 tends to have a further larger piezoelectric constant $d_{33}$. In contrast to the piezoelectric thin film 3, in a bulk of piezoelectric material, strain of a crystal structure caused by in-plane stress hardly occurs. Accordingly, as a great majority of the perovskite-type crystals composing the bulk of piezoelectric material are cubic crystals, it is difficult for the bulk of piezoelectric material to have piezoelectricity caused by the tetragonal crystals of perovskite-type crystals.

Since the piezoelectric thin film 3 has the composition and the crystal orientation described above, the piezoelectric thin film 3 can have a large piezoelectric constant ($d_{33}$). The crystal orientation described above is a property intrinsic to a thin film. The thin film is a crystalline film formed by a vapor phase growth process or a solution process. On the other hand, it is difficult for a bulk of piezoelectric material having the same composition as the piezoelectric thin film 3 to have the crystal orientation described above. The reason is that the bulk of piezoelectric material is a sintered material powder (ceramics) containing elements required for the piezoelectric material, so that it is difficult to control the structure and the orientation of many crystals composing the sintered material. Since the bulk of piezoelectric material contains Fe, the resistivity of the bulk of piezoelectric material is lower in comparison with the piezoelectric thin film 3. As a result, a leak current tends to occur in the bulk of piezoelectric material. Accordingly, it is difficult for the bulk of piezoelectric material to be polarized by application of a high electric field, and it is difficult for the bulk of piezoelectric material to have a large piezoelectric constant ($d_{33}$).

The metal oxide contained in the piezoelectric thin film 3 may be represented by chemical formula 1 described below. The chemical formula 1 is substantially the same as chemical formula 1a described below.

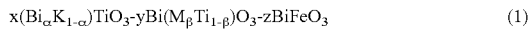

$$x(Bi_\alpha K_{1-\alpha})TiO_3\text{-}yBi(M_\beta Ti_{1-\beta})O_3\text{-}zBiFeO_3 \quad (1)$$

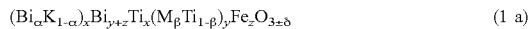

$$(Bi_\alpha K_{1-\alpha})_x Bi_{y+z} Ti_x (M_\beta Ti_{1-\beta})_y Fe_z O_{3\pm\delta} \quad (1a)$$

In the chemical formula 1, x, y and z each are positive real numbers. Here, x+y+z is 1. x in the chemical formula 1 is larger than 0 and less than 1. y in the chemical formula 1 is larger than 0 and less than 1. z in the chemical formula 1 is larger than 0 and less than 1. a in the chemical formula 1 is larger than 0 and less than 1. β in the chemical formula 1 is larger than 0 and less than 1. Since the piezoelectric thin film 3 tends to have a large $d_{33}$, α may be 0.5 and β may be 0.5. M in the chemical formula 1 is represented by $Mg_\gamma Ni_{1-\gamma}$. Here, γ is 0 or more and 1 or less. The total number of moles of Bi and K in the metal oxide may be represented by [A], the total number of moles of Ti, Fe and element M in the metal oxide may be represented by [B], and [A]/[B] may be 1.0. As long as the metal oxide can have a perovskite structure, [A]/[B] may be a value other than 1.0. In other words, [A]/[B] may be less than 1.0, or may be more than 1.0. In the chemical formula 1a, δ is 0 or more. As long as the metal oxide can have a perovskite structure, δ may be a value other than 0. For example, δ may be more than 0 and 1.0 or less. For example, δ may be calculated from valences of each of the ions at A-site and the ion at B-site of the perovskite structure. The valence of each of the ions may be measured by X-ray photoelectron spectroscopy (XPS). As long as the piezoelectricity of the piezoelectric thin film 3 is not impaired, the piezoelectric thin film 3 may contain another element in addition to Bi, K, Ti, Fe, an element M, and O.

In the following, $(Bi_\alpha K_{1-\alpha})TiO_3$ is written as BKT. $Bi(M_\beta Ti_{1-\beta})O_3$ is written as BMT. $BiFeO_3$ is written as BFO. A metal oxide having a composition represented by the sum of BKT and BMT is written as BKT-BMT. A metal oxide having a composition represented by the chemical formula 1 is written as xBKT-yBMT-zBFO. The crystals of BKT, BMT, BFO, BKT-BMT and xBKT-yBMT-zBFO each have a perovskite structure.

A crystal of BKT is tetragonal crystal at normal temperature, and BKT is a ferroelectric material. A crystal of BMT is rhombohedral crystal at normal temperature, and BMT is a ferroelectric material. A crystal of BFO is rhombohedral crystal at normal temperature, and BFO is a ferroelectric material. A thin film consisting of BKT-BMT is tetragonal crystal at normal temperature. The c/a of the tetragonal crystal of BKT-BMT tends to be larger than the c/a of each of BKT and BMT. A thin film consisting of BKT-BMT is excellent in ferroelectric properties compared with a thin film consisting of BKT and a thin film consisting of BMT. A thin film consisting of xBKT-yBMT-zBFO tends to be tetragonal crystal at normal temperature. The c/a of the tetragonal crystal of xBKT-yBMT-zBFO tends to be larger than the c/a of BKT-BMT. A thin film consisting of xBKT-yBMT-zBFO is excellent in ferroelectric properties compared with a thin film consisting of BKT-BMT. In other words, the piezoelectric thin film 3 containing xBKT-yBMT-zBFO may be a ferroelectric thin film. It is presumed that the ferroelectric properties of the piezoelectric thin film 3 are caused by the composition of xBKT-yBMT-zBFO having a morphotropic phase boundary (MPB). Having ferroelectric properties, the piezoelectric thin film 3 easily has a large piezoelectric constant ($d_{33}$). In contrast to the piezoelectric thin film 3, the crystal contained in the bulk of xBKT-yBMT-zBFO is quasi-cubic crystal, so that it is difficult for the bulk of xBKT-yBMT-zBFO to have the crystal orientation and ferroelectric properties described above.

Figure 4:
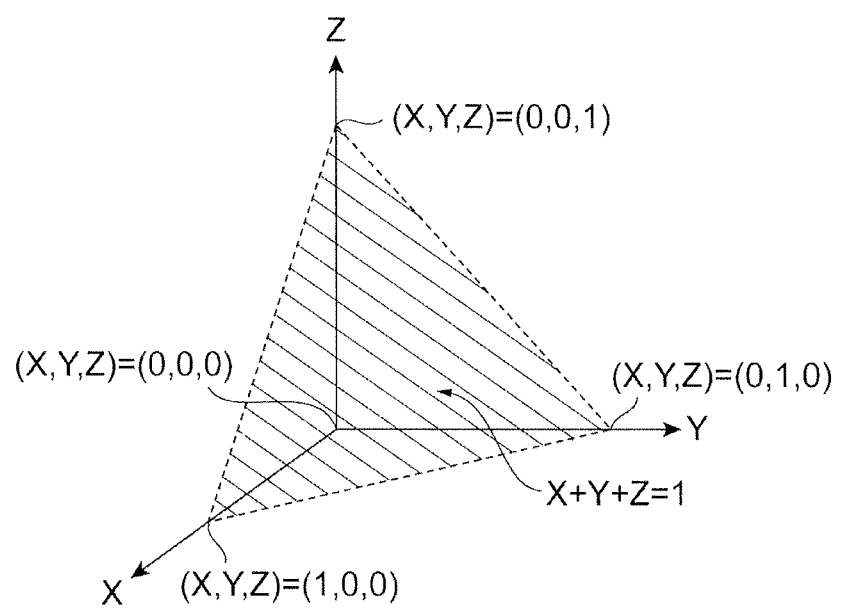
FIG. 4 is a three-dimensional coordinate system for showing the composition of a piezoelectric thin film.
Figure 5:
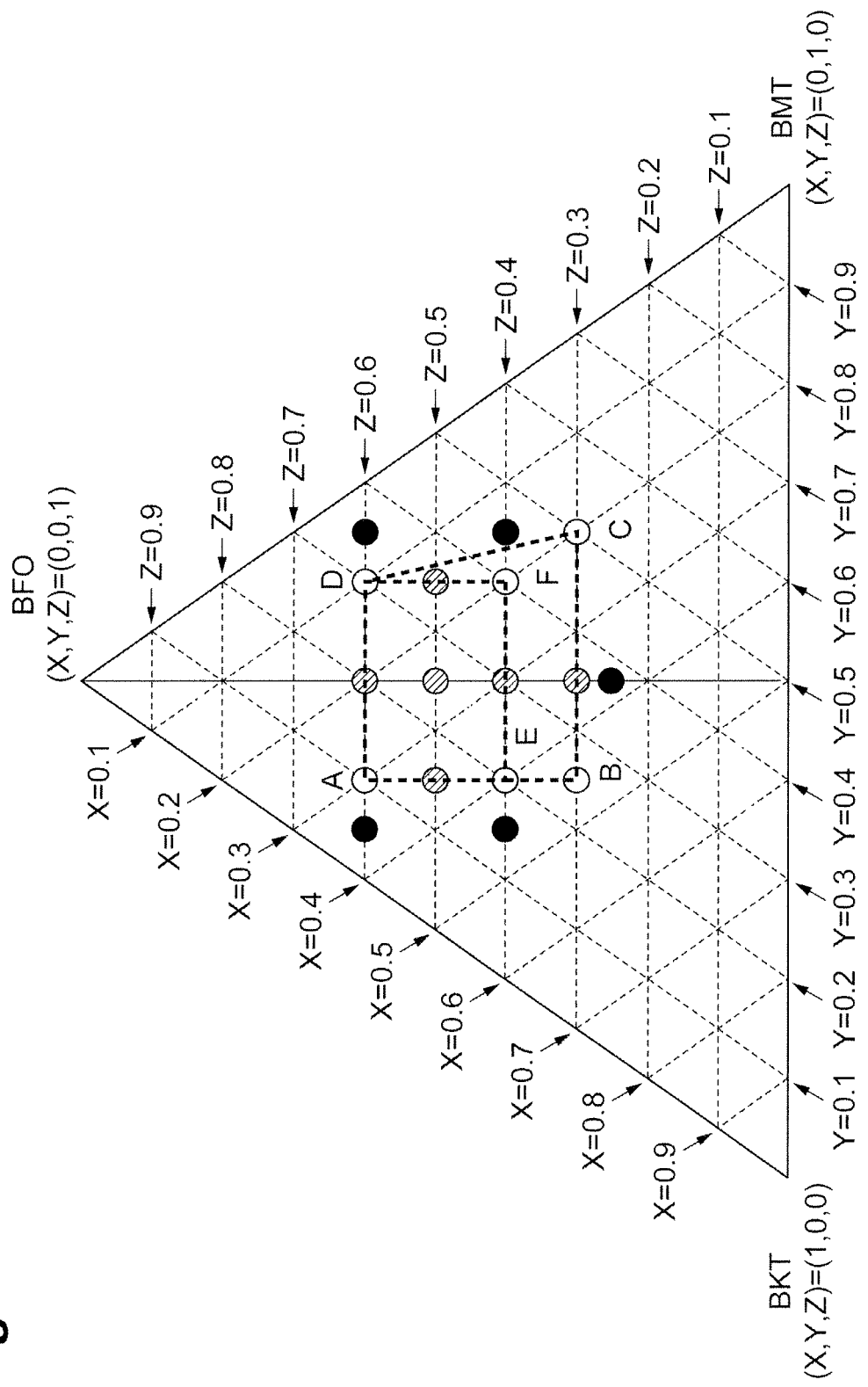
FIG. 5 is a triangle coordinate system corresponding to the triangle shown in FIG. 4.

A composition of xBKT-yBMT-zBFO may be represented based on a three-dimensional coordinate system. As shown in FIG. 4, the three-dimensional coordinate system is composed of an X-axis, a Y-axis and a Z-axis. Any coordinate in the coordinate system is represented by (X, Y, Z). Coordinates (x, y, z) in the coordinate system correspond to x, y and z in the chemical formula 1. The sum of x, y and z in the chemical formula 1 is 1, and any of x, y and z is a positive real number. Accordingly, the coordinates (x, y, z) are positioned inside a triangle drawn by dotted lines in a plane represented by X+Y+Z=1. In other words, the coordinates (x, y, z) are positioned inside a triangle with vertexes at the coordinates (1, 0, 0), the coordinates (1, 1, 0), and the coordinates (0, 0, 1). The triangle is shown in FIG. 5 as triangular coordinates. The coordinates A in FIG. 5 are (0.300, 0.100, 0.600). The coordinates B are (0.450, 0.250, 0.300). The coordinates C are (0.200, 0.500, 0.300). The coordinates D are (0.100, 0.300, 0.600). The coordinates E are (0.400, 0.200, 0.400). The coordinates F are (0.200, 0.400, 0.400). Any of the coordinates A, the coordinates B, the coordinates C, the coordinates D, the coordinates E and the coordinates F are positioned inside the plane represented by X+Y+Z=1. The coordinates (x, y, z) referring to x, y and z in the chemical formula 1 may be positioned within a quadrangle with vertexes at the coordinates A, the coordinates B, the coordinates C and the coordinates D. In the case where the coordinates (x, y, z) are within the quadrangle ABCD, the composition of xBKT-yBMT-zBFO easily has MPB, so that the piezoelectricity and the ferroelectric properties of the piezoelectric thin film 3 are easily improved. For the same reason, the coordinates (x, y, z) may be positioned within the quadrangle with vertexes at the coordinates A, the coordinates E, the coordinates F and the coordinates D. x may be equal to y. In the case where x is equal to y, the coordinates (x, y, z) are positioned on a straight line passing through coordinates (0.500, 0.500, 0) and coordinates (0, 0, 1). In the case where x is equal to y, the composition of xBKT-yBMT-zBFO easily has MPB, so that the piezoelectricity and the ferroelectric properties of the piezoelectric thin film 3 are easily improved.

x may be 0.100 or more and 0.450 or less; y may be 0.100 or more and 0.500 or less, and z may be 0.300 or more and 0.600 or less. x may be 0.100 or more and 0.400 or less; y may be 0.100 or more and 0.400 or less; and z may be 0.400 or more and 0.600 or less. x may be 0.150 or more and 0.350 or less; y may be 0.150 or more and 0.350 or less; and z may be 0.300 or more and 0.600 or less. x may be 0.250 or more and 0.300 or less; y may be 0.250 or more and 0.300 or less; and z may be 0.400 or more and 0.600 or less. In the case where x, y and z are in the range described above and x+y+z is 1, the composition of xBKT-yBMT-zBFO easily has MPB, so that the piezoelectricity and the ferroelectric properties of the piezoelectric thin film 3 are easily improved.

The thickness of the piezoelectric thin film 3 may be, for example, 10 nm or more and 10 μm or less. The area of the piezoelectric thin film 3 may be, for example, 1 μm$^2$ or more and 500 mm$^2$ or less. The area of each of the single crystal substrate 1, the first intermediate layer 5, the first electrode layer 2, the second intermediate layer 6, and the second electrode layer 4 may be the same as the area of the piezoelectric thin film 3.

The composition of the piezoelectric thin film may be analyzed, for example, by X-Ray fluorescence spectroscopy (XRF method) or inductively coupled plasma (ICP) emission spectroscopy. The crystal structure and the crystal orientation of the piezoelectric thin film may be identified by X-ray diffraction (XRD) method.

The piezoelectric thin film 3 may be formed, for example, by the following method.

As raw material for the piezoelectric thin film 3, a target having the same composition as the piezoelectric thin film 3 may be used. The method for making the target is as follows.

As starting materials, for example, powder of each of bismuth oxide, potassium carbonate, titanium oxide, an oxide of element M and iron oxide may be used. The oxide of element M may be at least any of magnesium oxide and nickel oxide. As starting materials, instead of the oxides described above, materials to be formed into oxides by sintering such as carbonates or oxalates may be used. These starting materials are sufficiently dried at 100° C. or more, and then each of the starting materials is weighed such that the number of moles of Bi, K, Ti, an element M, and Fe is within the range prescribed by the chemical formula 1. In the vapor phase growth process described below, Bi and K in a target are more volatile in comparison with other elements. Accordingly, the molar ratio of Bi in the target may be adjusted to a value higher than the molar ratio of Bi in the piezoelectric thin film 3. The molar ratio of K in the target may be adjusted to a value higher than the molar ratio of K in the piezoelectric thin film 3.

The starting materials weighed are sufficiently mixed in an organic solvent or water. The mixing time may be 5 hours or more and 20 hours or less. The mixing means may be a ball mill. The starting materials after mixing are sufficiently dried and then molded by a pressing machine. The molded starting materials are calcined to obtain a calcined material. The calcination temperature may be 750° C. or more and 900° C. or less. The calcination time may be 1 hour or more and 3 hours or less. The calcined material is pulverized in an organic solvent or water. The pulverizing time may be 5 hours or more and 30 hours or less. The pulverizing means may be a ball mill. After drying the calcined material pulverized, a binder solution is added to the calcined material to be granulated, so that powder of the calcined material is obtained. The powder of the calcined material is press-molded to obtain a molded product in a block form.

The molded product in a block form is heated to volatize the binder in the molded product. The heating temperature may be 400° C. or more and 800° C. or less. The heating time may be 2 hours or more and 4 hours or less. Subsequently, the molded product is sintered. The sintering temperature may be 800° C. or more and 1100° C. or less. The sintering time may be 2 hours or more and 4 hours or less. The temperature raising rate and the temperature lowering rate of the molded product in the sintering process may be, for example, 50° C./hour or more and 300° C./hour or less.

A target is obtained through the steps described above. The average particle diameter of crystal grains of the metal oxide contained in the target may be, for example, 1 μm or more and 20 μm or less.

By a vapor phase growth method using the target described above, the piezoelectric thin film 3 may be formed. In the vapor phase growth method, elements composing the target are vaporized under vacuum atmosphere. The vaporized elements are adhered to and deposited on any of the surfaces of the second intermediate layer 6, the first electrode layer 2 or the single crystal substrate 1, so that the piezoelectric thin film 3 grows. The vapor phase growth method may be, for example, a sputtering method, an electron beam vapor deposition method, a chemical vapor deposition method, or a pulsed-laser deposition method. In the following, a pulsed-laser deposition method is written as a PLD method. Use of these vapor phase growth methods allows the piezoelectric thin film 3 to be formed densely on the atomic level, with segregation of elements in the piezoelectric thin film 3 being suppressed. Depending on the type of vapor phase growth method, the excitation source is different. The excitation source of a sputtering method is an Ar plasma. The excitation source of an electron beam vapor deposition method is an electron beam. The excitation source of a PLD method is laser light (for example, excimer laser). When a target is exposed to these excitation sources, elements composing the target evaporate.

Among the vapor phase growth methods described above, the PLD method is relatively excellent in the following points. In the PLD method, each of the elements composing the target can be plasmatized in a moment without unevenness. Accordingly, the piezoelectric thin film 3 having an approximately the same composition as the target is easily formed. Further, in the PLD method, the thickness of the piezoelectric thin film 3 is easily controlled through changes in the number of pulses of laser (repetition frequency).

The piezoelectric thin film 3 may be an epitaxial film. In other words, the piezoelectric thin film 3 may be formed by epitaxial growth. A piezoelectric thin film 3 having excellent crystal orientation is easily formed by epitaxial growth. In the case where the piezoelectric thin film 3 is formed by the PLD method, the piezoelectric thin film 3 is easily formed by epitaxial growth.

In the PLD method, the piezoelectric thin film 3 may be formed during heating of the single crystal substrate 1 and the first electrode layer 2 in a vacuum chamber. The temperature of the single crystal substrate 1 and the first electrode layer 2 (deposition temperature) may be, for example, 300° C. or more and 800° C. or less, 500° C. or more and 700° C. or less, or 500° C. or more and 600° C. or less. The higher the deposition temperature is, the higher crystallinity of the piezoelectric thin film 3 is obtained with improved cleanliness of the surface of the single crystal substrate 1 or the first electrode layer 2, so that the orientation degree of the crystal plane tends to be increased. In the case where the deposition temperature is too high, Bi or K is easily detached from the piezoelectric thin film 3, so that it is difficult to control the composition of the piezoelectric thin film 3.

In the PLD method, the partial pressure of oxygen in a vacuum chamber may be, for example, more than 10 mTorr and less than 400 mTorr, 15 mTorr or more and 300 mTorr or less, or 20 mTorr or more and 200 mTorr or less. In other words, the partial pressure of oxygen in a vacuum chamber may be, for example, more than 1 Pa and less than 53 Pa, 2 Pa or more and 40 Pa or less, or 3 Pa or more and 30 Pa or less. With the partial pressure of oxygen being maintained in the range described above, Bi, K, Ti, an element M and Fe deposited on the single crystal substrate 1 tend to be sufficiently oxidized. In the case where the partial pressure of oxygen is too high, the growth rate of the piezoelectric thin film 3 tends to decrease, so that the orientation degree of the crystal plane of the piezoelectric thin film 3 tends to decrease.

Examples of the parameters other than those above controlled in the PLD method include the laser oscillation frequency and the distance between the substrate and the target. Through control of these parameters, the crystal structure and the crystal orientation of the piezoelectric thin film 3 are easily controlled. For example, in the case where the laser oscillation frequency is 10 Hz or less, the orientation degree of the crystal plane of the piezoelectric thin film 3 tends to be increased.

After growth of the piezoelectric thin film 3, an annealing treatment (heating treatment) of the piezoelectric thin film 3 may be performed. The temperature of the piezoelectric thin film 3 in the annealing treatment (annealing temperature) may be, for example, 300° C. or more and 1000° C. or less, 600° C. or more and 1000° C. or less, or 850° C. or more and 1000° C. or less. By the annealing treatment of the piezoelectric thin film 3, the piezoelectricity of the piezoelectric thin film 3 tends to be further improved. In particular, an annealing treatment at 850° C. or more and 1000° C. or less allows the piezoelectricity of the piezoelectric thin film 3 to be easily improved. The annealing treatment, however, is not indispensable.

The single crystal substrate 1 may be, for example, a substrate consisting of single crystal of Si, or a substrate consisting of a single crystal of a compound semiconductor such as GaAs. The single crystal substrate 1 may be a substrate consisting of a single crystal of oxide such as MgO or a perovskite-type oxide (for example, $SrTiO_3$). The thickness of the single crystal substrate 1 may be, for example, 10 m or more and 1000 m or less. In the case where the single crystal substrate 1 has conductivity, the single crystal substrate 1 functions as an electrode, so that the first electrode layer 2 needs not to exist. The single crystal substrate 1 having conductivity may be, for example, a single crystal of $SrTiO_3$ doped with niobium (Nb).

The crystal orientation of the single crystal substrate 1 may coincide with the normal direction $D_N$ of the surface of the single crystal substrate 1. In other words, the surface of the single crystal substrate 1 may be in parallel with the crystal plane of the single crystal substrate 1. The single crystal substrate 1 may be a uniaxially oriented substrate. For example, one crystal plane selected from the group consisting of the (100) plane, the (001) plane, the (110) plane, the (101) plane and the (111) plane may be in parallel with the surface of the single crystal substrate 1. In other words, one orientation selected from the group consisting of [100], [001], [110], [101] and [111] may be in parallel with the normal direction $D_N$ of the surface of the single crystal substrate 1.

In the case where the (100) plane of the single crystal substrate 1 (for example, Si) is in parallel with the surface of the single crystal substrate 1, the (001) plane of the perovskite-type crystal in the piezoelectric thin film 3 is easily oriented in the normal direction dn of the surface of the piezoelectric thin film 3. In the case where the (110) plane of the single crystal substrate 1 is in parallel with the surface of the single crystal substrate 1, the (110) plane of the perovskite-type crystal in the piezoelectric thin film 3 is easily oriented in the normal direction dn of the surface of the piezoelectric thin film 3. In the case where the (111) plane of the single crystal substrate 1 is in parallel with the surface of the single crystal substrate 1, the (111) plane of the perovskite-type crystal in the piezoelectric thin film 3 is easily oriented in the normal direction dn of the surface of the piezoelectric thin film 3.

As described above, the first intermediate layer 5 may be disposed between the single crystal substrate 1 and the first electrode layer 2. The first intermediate layer 5 may contain at least one selected from, for example, the group consisting of titanium (Ti), chromium (Cr), titanium oxide ($TiO_2$), silicon oxide ($SiO_2$), and zirconium oxide ($ZrO_2$). The interposition of the first intermediate layer 5 allows the first electrode layer 2 to be easily adhered to the single crystal substrate 1. The first intermediate layer 5 may be crystalline. The crystal plane of the first intermediate layer 5 may be oriented in the normal direction $D_N$ of the surface of the single crystal substrate 1. Both of the crystal plane of the single crystal substrate 1 and the crystal plane of the first intermediate layer 5 may be oriented in the normal direction $D_N$ of the surface of the single crystal substrate 1. The method for forming the first intermediate layer 5 may be a sputtering method, a vacuum deposition method, a printing method, a spin coating method, or a sol-gel method.

The first intermediate layer 5 may contain $ZrO_2$ and an oxide of rare earth elements. Since the first intermediate layer 5 contains $ZrO_2$ and the oxide of rare earth elements, the first electrode layer 2 consisting of platinum crystal is easily formed on the surface of the first intermediate layer 5, the (002) plane of the platinum crystal is easily oriented in the normal direction of the surface of the first electrode layer 2, and the (200) plane of the platinum crystal is easily oriented in the in-plane direction of the surface of the first electrode layer 2. The rare earth element may be at least one selected from the group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu). The first intermediate layer 5 may consist of yttria stabilized zirconia ($ZrO_2$ added with $Y_2O_3$). Due to the first intermediate layer 5 consisting of yttria stabilized zirconia, the first electrode layer 2 consisting of platinum crystal is easily formed on the surface of the first intermediate layer 5, the (002) plane of the platinum crystal is easily oriented in the normal direction of the surface of the first electrode layer 2, and the (200) plane of the platinum crystal is easily oriented in the in-plane direction of the surface of the first electrode layer 2. For the same reason, the first intermediate layer 5 may have a first layer consisting of $ZrO_2$ and a second layer consisting of $Y_2O_3$. The first layer may be directly laminated on the surface of the single crystal substrate 1, the second layer may be directly laminated on the surface of the first layer, and the first electrode layer 2 may be directly laminated on the surface of the second layer.

The first electrode layer 2 may consist of at least one metal selected from, for example, the group consisting of Pt (platinum), Pd (palladium), Rh (rhodium), Au (gold), Ru (ruthenium), Ir (iridium), Mo (molybdenum), Ti (titanium), Ta (tantalum) and Ni (nickel). The first electrode layer 2 may consist of, for example, a conductive metal oxide such as strontium ruthenate ($SrRuO_3$), lanthanum nickelate ($LaNiO_3$), or lanthanum strontium cobaltate ($(La, Sr)CoO_3$). The first electrode layer 2 may be crystalline. The crystal plane of the first electrode layer 2 may be oriented in the normal direction $D_N$ of the single crystal substrate 1. The crystal plane of the first electrode layer 2 may be approximately in parallel with the surface of the single crystal substrate 1. Both of the crystal plane of the single crystal substrate 1 and the crystal plane of the first electrode layer 2 may be oriented in the normal direction $D_N$ of the single crystal substrate 1. The crystal plane of the first electrode layer 2 may be approximately in parallel with the crystal plane of the perovskite-type crystal oriented in the piezoelectric thin film 3. The thickness of the first electrode layer 2 may be, for example, 1 nm or more and 1.0 μm or less. The method for forming the first electrode layer 2 may be a sputtering method, a vacuum deposition method, a printing method, a spin coating method, or a sol-gel method. In the case of the printing method, the spin coating method or the sol-gel method, a heating treatment (annealing) of the first electrode layer 2 may be performed to enhance the crystallinity of the first electrode layer 2.

The first electrode layer 2 may contain a platinum crystal. The first electrode layer 2 may consist of platinum crystal only. The platinum crystal is a cubic crystal having a face-centered cubic lattice structure. The (002) plane of the platinum crystal may be oriented in the normal direction of the surface of the first electrode layer 2, and the (200) plane of the platinum crystal may be oriented in the in-plane direction of the surface of the first electrode layer 2. In other words, the (002) plane of the platinum crystal may be approximately in parallel with the surface of the first electrode layer 2, ant the (200) plane of the platinum crystal may be approximately vertical to the surface of the first electrode layer 2. Since the (002) plane and the (200) plane of the platinum crystal composing the first electrode layer 2 have the orientation described above, the piezoelectric thin film 3 easily epitaxially grows on the surface of the first electrode layer 2, the piezoelectric thin film 3 easily contains the tetragonal crystal of a perovskite-type crystal, and the (001) plane of the tetragonal crystal tends to be preferentially oriented in the normal direction dn of the surface of the piezoelectric thin film 3. The surface of the first electrode layer 2 may be approximately in parallel with the surface of the piezoelectric thin film 3. In other words, the normal direction of the surface of the first electrode layer 2 may be approximately in parallel with the normal direction dn of the surface of the piezoelectric thin film 3.

As described above, the second intermediate layer 6 may be disposed between the first electrode layer 2 and the piezoelectric thin film 3. The second intermediate layer 6 may contain at least one selected from, for example, the group consisting of $SrRuO_3$, $LaNiO_3$, and $(La, Sr)CoO_3$. The interposition of the second intermediate layer 6 allows the piezoelectric thin film 3 to easily adhere to the first electrode layer 2. The second intermediate layer 6 may be crystalline. The crystal plane of the second intermediate layer 6 may be oriented in the normal direction $D_N$ of the surface of the single crystal substrate 1. Both of the crystal plane of the single crystal substrate 1 and the crystal plane of the second intermediate layer 6 may be oriented in the normal direction $D_N$ of the surface of the single crystal substrate 1. The method for forming the second intermediate layer 6 may be a sputtering method, a vacuum deposition method, a printing method, a spin coating method, or a sol-gel method.

The second electrode layer 4 may consist of at least one metal selected from, for example, the group consisting of Pt, Pd, Rh, Au, Ru, Ir, Mo, Ti, Ta and Ni. The second electrode layer 4 may consist of at least one conductive metal oxide selected from, for example, the group consisting of $LaNiO_3$, $SrRuO_3$, and $(La, Sr)CoO_3$. The second electrode layer 4 may be crystalline. The crystal plane of the second electrode layer 4 may be oriented in the normal direction $D_N$ of the single crystal substrate 1. The crystal plane of the second electrode layer 4 may be approximately in parallel with the surface of the single crystal substrate 1. The crystal plane of the second electrode layer 4 may be approximately in parallel with the crystal plane of the perovskite-type crystal oriented in the piezoelectric thin film 3. The thickness of the second electrode layer 4 may be, for example, 1 nm or more and 1.0 m or less. The method for forming the second electrode layer 4 may be a sputtering method, a vacuum deposition method, a printing method, a spin coating method, or a sol-gel method. In the case of the printing method, the spin coating method or the sol-gel method, a heating treatment (annealing) of the second electrode layer 4 may be performed to enhance the crystallinity of the second electrode layer 4.

A third intermediate layer may be disposed between the piezoelectric thin film 3 and the second electrode layer 4. The interposition of the third intermediate layer allows the second electrode layer 4 to easily adhere to the piezoelectric thin film 3. The composition, the crystal structure, and the forming method of the third intermediate layer may be the same as those of the second intermediate layer.

At least a part or the whole of the surface of the piezoelectric thin film device 10 may be covered with a protective film. The covering with a protective film improves, for example, the moisture resistance of the piezoelectric thin film device 10.

The applications of the piezoelectric thin film device according to the present embodiment are various. The piezoelectric thin film device may be used, for example, for a piezoelectric actuator. The piezoelectric actuator may be used, for example, for a head assembly, a head stack assembly, or a hard disk drive. The piezoelectric actuator may be used, for example, for a printer head or an ink jet printer device. The piezoelectric device may be, for example, a piezoelectric transducer. The piezoelectric thin film device may be used, for example, for a piezoelectric sensor. The piezoelectric sensor may be, for example, a gyro sensor, a pressure sensor, a pulse wave sensor, an ultrasonic sensor, or a shock sensor. The piezoelectric thin film device may be applied, for example, to a microphone. The piezoelectric thin film device may be applied to a part of micro electro mechanical systems (MEMS).

Figure 6:
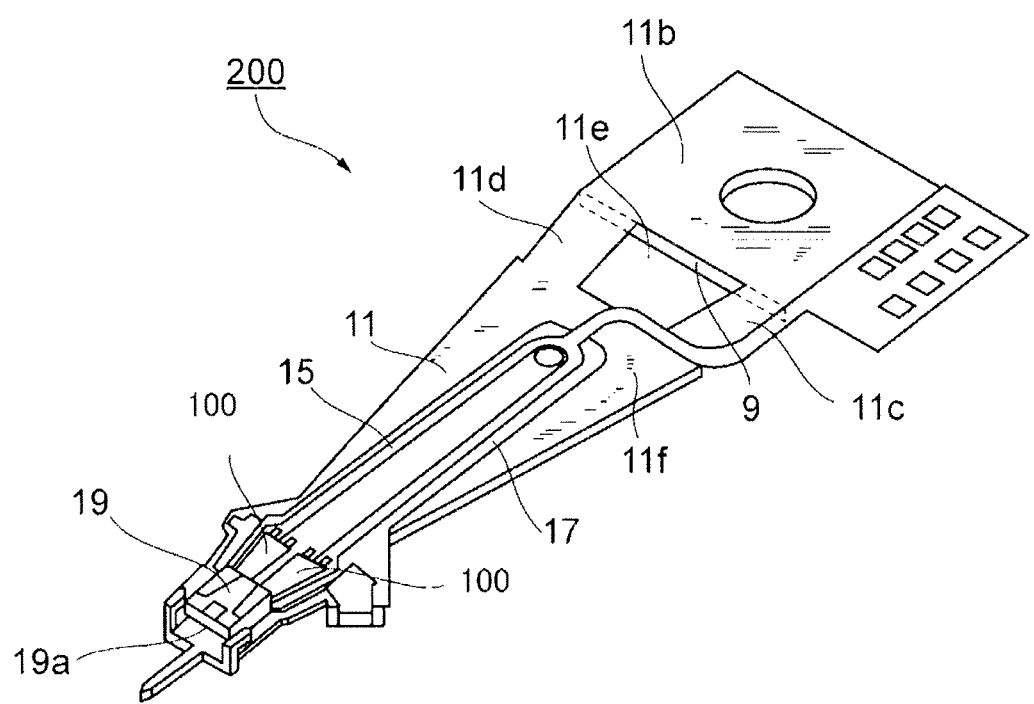
FIG. 6 is a schematic view of a head assembly according to an embodiment of the present invention.

(Piezoelectric Actuator) FIG. 6 shows a head assembly 200 to be installed on a hard disk drive (HDD). The head assembly 200 comprises a base plate 9, a load beam 11, a flexure 17, a first and a second piezoelectric thin film device 100, and a head slider 19. The first and second piezoelectric thin film devices 100 are drive devices for the head slider 19. The head slider 19 has a head device 19a.

The load beam 11 comprises a base end part 11b fastened to the base plate 9, a first leaf spring part 11c and a second leaf spring part 11d extending from the base end part 11b, and an aperture 11e formed between the leaf springs 11c and 11d, and a beam main part 11f extending linearly to continue to the leaf spring parts 11c and 11d. The first leaf spring part 11c and the second leaf spring part 11d are tapered. The beam main part 11f also is tapered.

The first and second piezoelectric thin film devices 100 are disposed at a specified distance on a wiring flexible substrate 15 as a part of the flexure 17. The head slider 19 is fixed to an end of the flexure 17 and rotated with extension and contraction of the first and second piezoelectric thin film devices 100.

Figure 7:
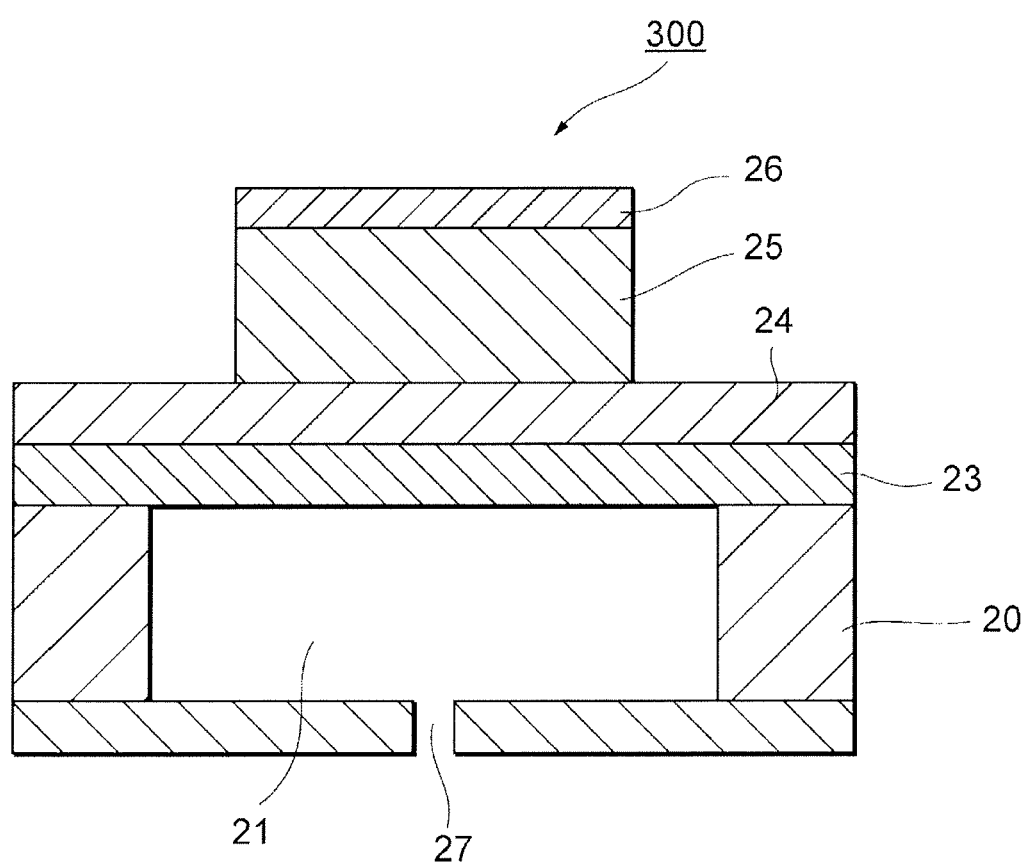
FIG. 7 is a schematic view of a piezoelectric actuator according to an embodiment of the present invention.

FIG. 7 shows a piezoelectric actuator 300 for printer head. The piezoelectric actuator 300 comprises a base 20, an insulating film 23 stacked on the base 20, a single crystal substrate 14 stacked on the insulating film 23, a piezoelectric thin film 25 stacked on the single crystal substrate 14, and an upper electrode layer 26 (second electrode layer) stacked on the piezoelectric thin film 25. The single crystal substrate 14 has conductivity and also has functions as a lower electrode layer. The lower electrode layer may be paraphrased as the first electrode layer described above. The upper electrode layer may be paraphrased as the second electrode layer described above.

In the case where no specified discharge signal is supplied and no electric field is applied between the single crystal substrate 14 (lower electrode layer) and the upper electrode layer 26, the piezoelectric thin film 25 is not deformed. In a pressure chamber 21 adjacent to the piezoelectric thin film 25 to which no discharge signal is supplied, no pressure change occurs, so that no ink drop is discharged from a nozzle 27 thereof.

On the other hand, in the case where a specified discharge signal is supplied and an electric field is applied between the single crystal substrate 14 (lower electrode layer) and the upper electrode layer 26, the piezoelectric thin film 25 is deformed. Since the insulating film 23 undergoes a large deflection due to the deformation of the piezoelectric thin film 25, the pressure in the pressure chamber 21 instantly increases, so that an ink drop is discharged from the nozzle 27.

(Pressure Sensor)

Figure 8:
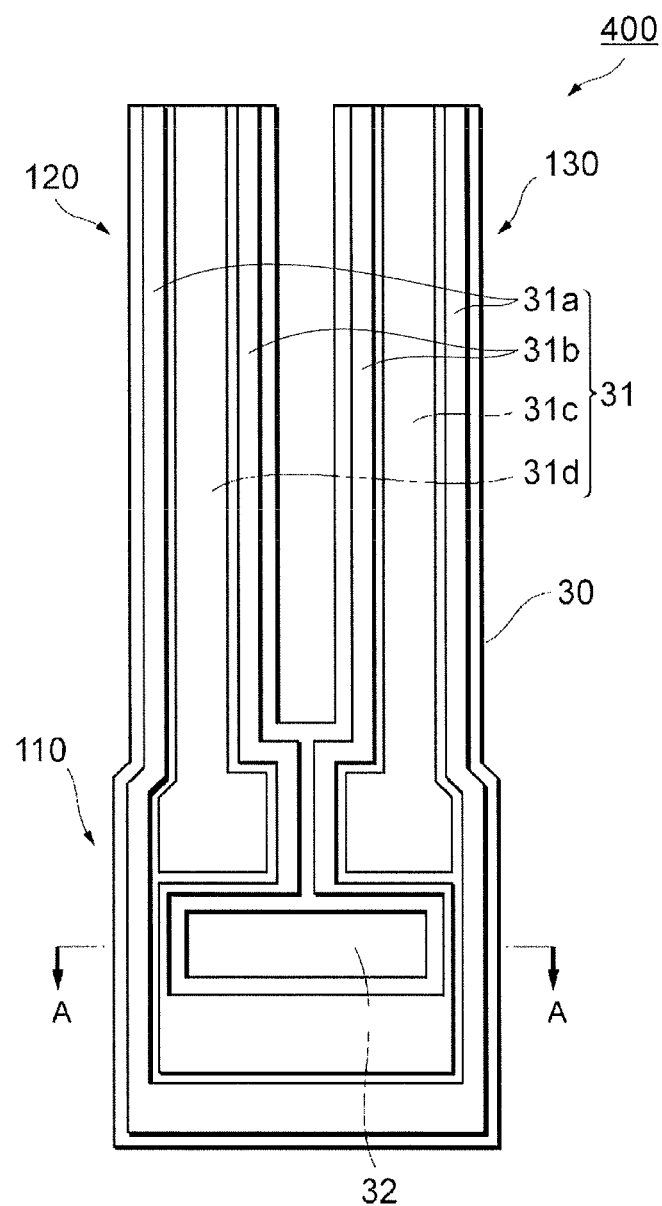
FIG. 8 is a schematic view (plan view) of a gyro sensor according to an embodiment of the present invention.
Figure 9:
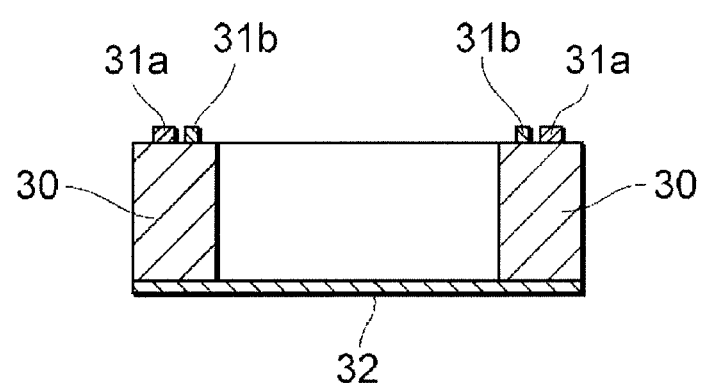
FIG. 9 is a cross-sectional view of the gyro sensor shown in FIG. 8, viewed along arrows A-A.

FIG. 8 and FIG. 9 show a gyro sensor 400, which is a type of piezoelectric sensors. The gyro sensor 400 comprises a base 110, a pair of arms 120 and 130 connected to a surface of the base 110. The pair of arms 120 and 130 is a tuning fork oscillator. In other words, the gyro sensor 400 is a tuning fork oscillator-type angular velocity detecting device. The gyro sensor 400 is obtained by processing a piezoelectric thin film 30, an upper electrode layer 31 and a single crystal substrate 32 composing the piezoelectric thin film device described above into the shape of a tuning fork-type oscillator. The base 110 and the arms 120 and 130 are integrated with the piezoelectric thin film device. The single crystal substrate 32 has conductivity and also has functions as the lower electrode layer.

On a first main surface of one arm 120, drive electrode layers 31a and 31b and a detection electrode layer 31d are formed. In the same manner, on a first main surface of another arm 130, drive electrode layers 31a and 31b and a detection electrode layer 31c are formed. Each of the electrode layers 31a, 31b, 31c and 31d is obtained by etching the upper electrode layer 31 into a specified electrode shape.

The single crystal substrate 32 (lower electrode layer) is formed on the entire of a second main surface (back side of the first main surface) of each of the base 110 and the arms 120 and 130. The single crystal substrate 32 (lower electrode layer) functions as a ground electrode of the gyro sensor 400.

The longitudinal direction of each of the arms 120 and 130 is defined as Z-direction, and the plane including the main surfaces of the arms 120 and 130 is defined as XZ plane, whereby an XYZ rectangular coordinate system is defined.

When a drive signal is supplied to the drive electrode layers 31a and 31b, the two arms 120 and 130 are excited in an in-plane oscillation mode. The in-plane oscillation mode is a mode in which the two arms 120 and 130 are excited in the direction parallel with the main surfaces of the two arms 120 and 130. For example, when an arm 120 is excited at a velocity V1 in the minus X direction, another arm 130 is excited at a velocity V2 in the plus X direction.

In such a state, when rotation at an angular velocity ω around Z-axis as rotation axis is added to the gyro sensor 400, a Coriolis force is applied to each of the arms 120 and 130 in the direction orthogonal to the velocity direction. As a result, the arms 120 and 130 start excitation in an out-of-plane oscillation mode. The out-of-plane oscillation mode is a mode in which the two arms 120 and 130 excite in the direction orthogonal to the main surfaces of the two arms 120 and 130. For example, when a Coriolis force F1 applied to one arm 120 is in the minus Y direction, a Coriolis force F2 applied to another arm 130 is in the plus Y direction.

Since the magnitude of the Coriolis forces F1 and F2 is proportional to the angular velocity ω, the mechanical distortion of the arms 120 and 130 caused by the Coriolis forces F1 and F2 is converted to electrical signals (detection signals) by the piezoelectric thin film 30, which are drawn from the detection electrode layers 31c and 31d to detect the angular velocity ω.

Figure 10:
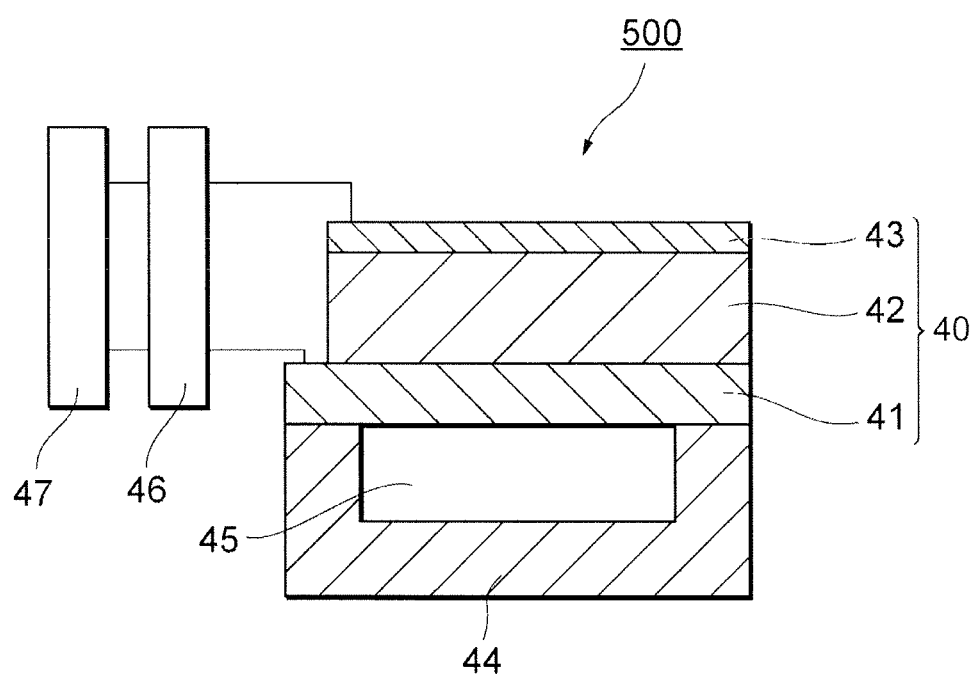
FIG. 10 is a schematic view of a pressure sensor according to an embodiment of the present invention.

FIG. 10 shows a pressure sensor 500 which is a type of piezoelectric sensors. The pressure sensor 500 comprises a piezoelectric thin film device 40, a support 44 supporting the piezoelectric thin film device 40, a current amplifier 46, and a voltmeter 47. The piezoelectric thin film device 40 consists of a common electrode layer 41, a piezoelectric thin film 42 stacked on the common electrode layer 41, and an individual electrode layer 43 stacked on the piezoelectric thin film 42. The common electrode layer 41 is a conductive single crystal substrate. A cavity 45 surrounded by the common electrode layer 41 and the support 44 responds to pressure. When an external force is applied to the pressure sensor 500, the piezoelectric thin film device 40 undergoes a deflection and a voltage is detected by the voltmeter 47.

Figure 11:
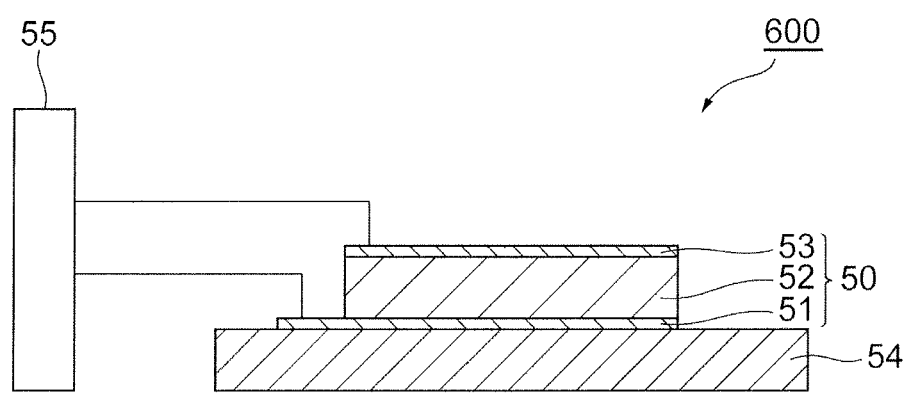
FIG. 11 is a schematic view of a pulse wave sensor according to an embodiment of the present invention.

FIG. 11 shows a pulse wave sensor 600 which is a type of piezoelectric sensors. The pulse wave sensor 600 comprises a piezoelectric thin film device 50, a support 54 supporting the piezoelectric thin film device 50, and a voltmeter 55. The piezoelectric thin film device 50 consists of a common electrode layer 51, a piezoelectric thin film 52 stacked on the common electrode layer 51, and an individual electrode layer 53 stacked on the piezoelectric thin film 52. The common electrode layer 51 is a conductive single crystal substrate. When the back side of the support 54 of the pulse wave sensor 600 (surface on which no piezoelectric thin film device 50 is installed) is brought into contact with an artery of a living body, the support 54 and the piezoelectric thin film device 50 undergoes a deflection due to the pressure of the pulse of the living body and a voltage is detected by the voltmeter 55.

(Hard Disk Drive)

Figure 12:
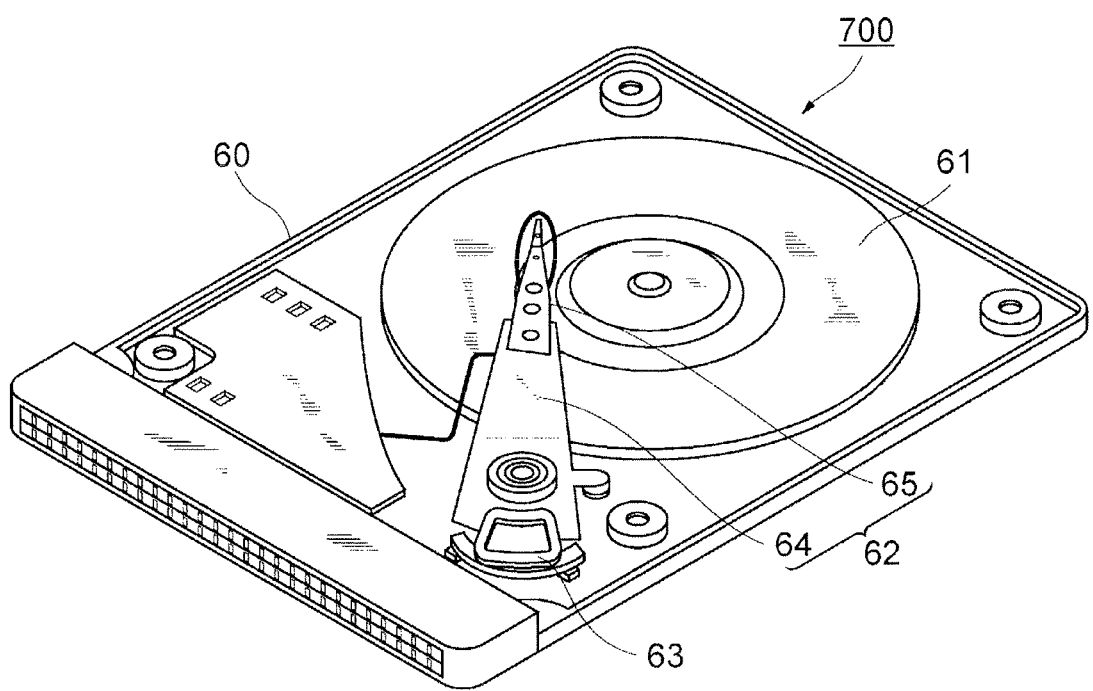
FIG. 12 is a schematic view of a hard disk drive according to an embodiment of the present invention.

FIG. 12 shows a hard disk drive 700 with the head assembly shown in FIG. 6 installed. A head assembly 65 in FIG. 12 is the same as the head assembly 200 in FIG. 6.

The hard disk drive 700 comprises a housing 60, a hard disk 61 (recording medium) disposed in the housing 60, and a head stack assembly 62. The hard disk 61 is rotated by a motor. The head stack assembly 62 records magnetic data onto the hard disk 61 or reproduces the magnetic data recorded on the hard disk 61.

The head stack assembly 62 has a voice coil motor 63, an actuator arm 64 supported on a spindle, and a head assembly 65 connected to the actuator arm 64. The actuator arm 64 is freely rotated around the spindle by the voice coil motor 63. The actuator arm 64 is branched into a plurality of arms, and the head assembly 65 is connected to each of the arms. In other words, a plurality of arms and head assemblies 65 are stacked along the spindle. At the end of the head assembly 65, a head slider 19 is fixed to face the hard disk 61.

The head assembly 65 (200) allows a head device 19$a$ to be moved in two steps. A relatively large movement of the head device 19$a$ is controlled by the entire drive of the head assembly 65 and the actuator arm 64 by the voice coil motor 63. A micro movement of the head device 19$a$ is controlled by the drive of the head slider 19 positioned at the end of the head assembly 65.

(Ink Jet Printer Device)

Figure 13:
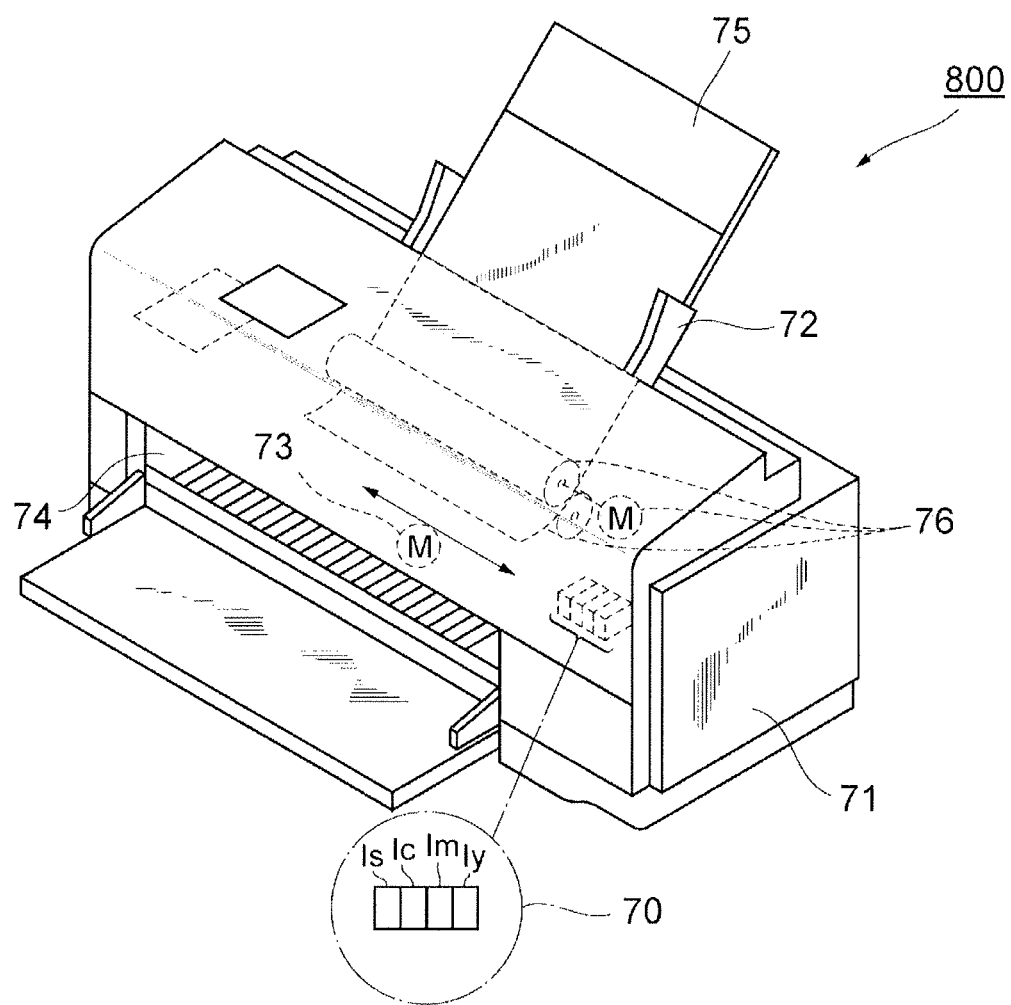
FIG. 13 is a schematic view of an ink jet printer device according to an embodiment of the present invention.

FIG. 13 shows an ink jet printer device 800. The ink jet printer device 800 comprises a printer head 70, a main body 71, a tray 72 and a head drive mechanism 73. The printer head 70 in FIG. 13 has a piezoelectric actuator 300 in FIG. 7.

The ink jet printer device 800 comprises ink cartridges of total four colors of yellow, magenta, cyan and black. A full color printing can be performed by the ink jet printer device 800. In the internal part of the ink jet printer device 800, a dedicated controller board or the like is installed. The dedicated controller board or the like controls the discharge timing of ink from the printer head 70 and the scanning of the head drive mechanism 73. On the back side of the main body 71, a tray 72 is disposed, and at one end of the tray 72, an auto sheet feeder (automatic continuous paper feed mechanism) 76 is disposed. The auto sheet feeder 76 automatically feeds a recording sheet 75 and ejects the recording sheet 75 from a front outlet 74.

EXAMPLES

The present invention is described in further detail with reference to Examples as follows, though the present invention is not limited to the Examples.

Example 1

A single crystal substrate consisting of Si was used for making of a piezoelectric thin film device in Example 1. The (100) plane of Si was in parallel with the surface of the single crystal substrate. The single crystal substrate was in a square shape with dimensions of 20 mm×20 mm. The thickness of the single crystal substrate was 500 m.

In a vacuum chamber, a crystalline first intermediate layer consisting of $ZrO_2$ and $Y_2O_3$ was formed on the entire surface of the single crystal substrate. The first intermediate layer was formed by a sputtering method. The thickness of the first intermediate layer was 30 nm.

In a vacuum chamber, a first electrode layer consisting of Pt crystal was formed on the entire surface of the first intermediate layer. The first electrode layer was formed by a sputtering method. The thickness of the first electrode layer was 200 nm. The temperature of the single crystal substrate (deposition temperature) was maintained at 500° C. in the step of forming the first electrode layer.

An X-ray diffraction (XRD) pattern of the first electrode layer was measured by the out-of-plane measurement of the surface of the first electrode layer. Another XRD pattern of the first electrode layer was measured by the in-plane measurement of the surface of the first electrode layer. In the measurement of these XRD patterns, an X-ray diffraction apparatus (SmartLab) manufactured by Rigaku Corporation was used. The measurement conditions were set such that each of the peak intensities in the XRD pattern was higher at least by three orders of magnitude relative to the background intensity. A Peak of X-ray diffraction of the (002) plane of the Pt crystal was detected by the out-of-plane measurement. In other words, the (002) plane of the Pt crystal was oriented in the normal direction of the surface of the first electrode layer. A Peak of X-ray diffraction of the (200) plane of the Pt crystal was detected by the in-plane measurement. In other words, the (200) plane of the Pt crystal was oriented in the in-plane direction of the surface of the first electrode layer.

In a vacuum chamber, a piezoelectric thin film was formed on the entire surface of the first electrode layer. The piezoelectric thin film was formed by a PLD method. The thickness of the piezoelectric thin film was 2000 nm. The temperature of the single crystal substrate (deposition temperature) was maintained at 500° C. in the step of forming the piezoelectric thin film. The partial pressure of oxygen in the vacuum chamber in the step of forming the piezoelectric thin film was maintained at 10 Pa. As raw material of the piezoelectric thin film, a target (sintered material of raw material powder) was used. In making of the target, the compounding ratio of the raw material powder (bismuth oxide, potassium carbonate, titanium oxide, magnesium oxide and iron oxide) was adjusted to correspond to the intended composition of the piezoelectric thin film. The intended composition of the piezoelectric thin film was represented by chemical formula 1A decribed below. In the chemical formula 1A, a value of each of x, y and z was a value shown in the following Table 1.

$$xBi_{0.5}K_{0.5}TiO_3\text{-}yBiMg_{0.5}Ti_{0.5}O_3\text{-}zBiFeO_3 \qquad (1A)$$

The composition of the piezoelectric thin film was analyzed by X-Ray fluorescence spectroscopy (XRF method). An apparatus PW2404 manufactured by Philips Japan, Ltd. was used for the analysis. As a result of analysis, the composition of the piezoelectric thin film in Example 1 was represented by the chemical formula 1A, and the value of each of x, y and z in the chemical formula 1A was a value shown in the following Table 1. In other words, the composition of the piezoelectric thin film approximately coincided with the composition of the target.

An XRD pattern of the piezoelectric thin film was measured by the out-of-plane measurement of the surface of the piezoelectric thin film. Another XRD pattern of the piezoelectric thin film was measured by the in-plane measurement of the surface of the piezoelectric thin film. The measurement apparatus and the measurement conditions of the XRD patterns were the same as those described above.

The XRD pattern of the piezoelectric thin film indicated that the piezoelectric thin film is composed of a perovskite-type crystal. Peaks of the X-ray diffraction of the (001) plane of the perovskite-type crystal were detected by the out-of-plane measurement. In other words, the (001) plane of the perovskite-type crystal was oriented in the normal direction of the surface of the piezoelectric thin film. The orientation degree of the (001) plane of the perovskite-type crystal was calculated based on the XRD pattern. The orientation degree of the (001) plane is represented by $100 \times I_{(001)}/\Sigma I_{(hkl)}$. The detail of the definition of orientation degree is as described above. The orientation degree of the (001) plane in Example 1 is shown in the following Table 1.

The lattice constant c of the perovskite-type crystal in the normal direction of the surface of the piezoelectric thin film was obtained by the out-of-plane measurement. The lattice constant c is paraphrased as the distance between the crystal planes in parallel with the surface of the piezoelectric thin film. The lattice constants a and b of the perovskite-type crystal in the direction parallel with the surface of the piezoelectric thin film were obtained by the in-plane measurement. The lattice constants a and b are paraphrased as the distance between the crystal planes vertical to the surface of the piezoelectric thin film. The lattice constants a and b were approximately equal to each other. Any of a and b was smaller than c. In other words, the perovskite-type crystal contained in the piezoelectric thin film was a tetragonal crystal.

By the method described above, a laminate comprising a single crystal substrate, a first intermediate layer stacked on the single crystal substrate, a first electrode layer stacked on the first intermediate layer, and a piezoelectric thin film stacked on the first electrode layer was made. The following step using the laminate was further performed.

A second electrode layer consisting of Pt was formed on the entire surface of the piezoelectric thin film in a vacuum chamber. The second electrode layer was formed by a sputtering method. The temperature of the single crystal substrate in the step of forming the second electrode layer was maintained at 500° C. The thickness of the second electrode layer was 200 nm.

Through the steps described above, a laminate comprising a single crystal substrate, a first intermediate layer stacked on the single crystal substrate, a first electrode layer stacked on the first intermediate layer, a piezoelectric thin film stacked on the first electrode layer, and a second electrode layer stacked on the piezoelectric thin film was made. In the subsequent photolithography, patterning of the laminate structure on the single crystal substrate was performed. After the patterning, the laminate was cut by dicing.

Through the steps described above, a piezoelectric thin film device in a strip form in Example 1 was obtained. The piezoelectric thin film device comprised a single crystal substrate, a first intermediate layer stacked on the single crystal substrate, a first electrode layer stacked on the first intermediate layer, a piezoelectric thin film stacked on the first electrode layer, and a second electrode layer stacked on the piezoelectric thin film. The area of a movable portion of the piezoelectric thin film was 20 mm×1.0 mm.

[Measurement of Piezoelectric Constant $d_{33, f}$]

The piezoelectric constant $d_{33, f}$ of the piezoelectric thin film was measured by using the piezoelectric thin film device in Example 1. An apparatus including an atomic force microscope (AFM) and a ferroelectric material evaluation system in combination was used in the measurement. The atomic force microscope was SPA-400 manufactured by Seiko Instruments Inc., and the ferroelectric material evaluation system was FCE manufactured by TOYO Corporation. The frequency of the alternating electric field (alternating voltage) in the measurement of the piezoelectric constant $d_{33, f}$ was 5 Hz. The maximum value of the voltage applied to the piezoelectric thin film was 20 V. The unit of $d_{33, f}$ is pm/V. The piezoelectric constant $d_{33, f}$ of Example 1 is shown in the following Table 1.

Examples 2 to 18 and Comparative Examples 1 to 3

A piezoelectric thin film device of each of Examples 2 to 18 and Comparative Examples 1 to 3 was made in the same manner as in Example 1, except that the composition of the target used for forming the piezoelectric thin film was different.

An XRD pattern of the first electrode layer of each of Examples 2 to 18 was measured in the same manner as Example 1. In any cases of Examples 2 to 18, the (002) plane of the Pt crystal composing the first electrode layer was oriented in the normal direction of the surface of the first electrode layer, and the (200) plane of the Pt crystal was oriented in the in-plane direction of the surface of the first electrode layer.

A composition of the piezoelectric thin film of each of Examples 2 to 18 and Comparative Examples 1 to 3 was analyzed in the same manner as Example 1. In any cases of Examples 2 to 18 and Comparative Examples 1 to 3, the composition of the piezoelectric thin film approximately coincided with the composition of the target. The composition of the piezoelectric thin film (values of x, y and z each) of each of Examples 2 to 18 and Comparative Examples 1 to 3 is shown in the following Table 1. x, y and z of each of Examples 2 to 16 and 18 are shown as coordinates (x, y, z) in FIG. 5 (triangular coordinates). The coordinates A in FIG. 5 correspond to Example 1. The coordinates B in FIG. 5 correspond to Example 2. The coordinates C in FIG. 5 correspond to Example 3. The coordinates D in FIG. 5 correspond to Example 4. The coordinates E in FIG. 5 correspond to Example 5. The coordinates F in FIG. 5 correspond to Example 6.

XRD patterns of the piezoelectric thin film of each of Examples 2 to 18 and Comparative Examples 1 to 3 were measured in the same manner as Example 1. Any of the XRD patterns in Examples 2 to 18 and Comparative Examples 1 to 3 indicated that the piezoelectric thin film is composed of a perovskite-type crystal. In any cases of Examples 2 to 18 and Comparative Examples 1 to 3, the (001) plane of the perovskite-type crystal was oriented in the normal direction of the surface of the piezoelectric thin film. In any cases of Examples 2 to 18, the perovskite-type crystal contained in the piezoelectric thin film was a tetragonal crystal. The orientation degree of the (001) plane of each of Examples 2 to 18 and Comparative Examples 1 to 3 is shown in the following Table 1.

The piezoelectric constant $d_{33, f}$ of the piezoelectric thin film of each of Examples 2 to 18 and Comparative Examples 1 to 3 was measured in the same manner as Example 1. The piezoelectric constant $d_{33,f}$ of each of Examples 2 to 18 and Comparative Examples 1 to 3 is shown in the following Table 1.

TABLE 1

| | Piezoelectric thin film | | | | | |
|---|---|---|---|---|---|---|
| | x | y | z | Oriented plane | Orientation degree [%] | $d_{33,f}$ |
| Example 1 | 0.300 | 0.100 | 0.600 | (001) plane | 99 | 92 |
| Example 2 | 0.450 | 0.250 | 0.300 | (001) plane | 99 | 81 |
| Example 3 | 0.200 | 0.500 | 0.300 | (001) plane | 99 | 84 |
| Example 4 | 0.100 | 0.300 | 0.600 | (001) plane | 99 | 91 |
| Example 5 | 0.400 | 0.200 | 0.400 | (001) plane | 99 | 95 |
| Example 6 | 0.200 | 0.400 | 0.400 | (001) plane | 99 | 94 |
| Example 7 | 0.350 | 0.150 | 0.500 | (001) plane | 99 | 88 |
| Example 8 | 0.150 | 0.350 | 0.500 | (001) plane | 99 | 93 |
| Example 9 | 0.250 | 0.250 | 0.500 | (001) plane | 99 | 110 |
| Example 10 | 0.200 | 0.200 | 0.600 | (001) plane | 99 | 104 |
| Example 11 | 0.300 | 0.300 | 0.400 | (001) plane | 99 | 98 |
| Example 12 | 0.350 | 0.350 | 0.300 | (001) plane | 99 | 87 |
| Example 13 | 0.450 | 0.150 | 0.400 | (001) plane | 99 | 76 |
| Example 14 | 0.150 | 0.450 | 0.400 | (001) plane | 99 | 73 |
| Example 15 | 0.350 | 0.050 | 0.600 | (001) plane | 99 | 78 |
| Example 16 | 0.050 | 0.350 | 0.600 | (001) plane | 99 | 75 |
| Example 17 | 0.325 | 0.325 | 0.350 | (001) plane | 99 | 72 |
| Example 18 | 0.375 | 0.375 | 0.250 | (001) plane | 99 | 74 |
| Comparative Example 1 | 0.500 | 0.000 | 0.500 | (001) plane | 99 | 48 |
| Comparative Example 2 | 0.800 | 0.200 | 0.000 | (001) plane | 99 | 32 |
| Comparative Example 3 | 0.000 | 0.500 | 0.500 | (001) plane | 99 | 20 |

Examples 20 and 21 and Comparative Example 4

The partial pressure of oxygen in a vacuum chamber in the step of forming the piezoelectric thin film of Example 20 was maintained at 1 Pa.

The partial pressure of oxygen in a vacuum chamber in the step of forming the piezoelectric thin film of Example 21 was maintained at 20 Pa.

The partial pressure of oxygen in a vacuum chamber in the step of forming the piezoelectric thin film of Comparative Example 4 was maintained at 0.1 Pa.

A piezoelectric thin film device of each of Examples 20 and 21 and Comparative Example 4 was made in the same manner as Example 9, except for the partial pressure of oxygen in the step of forming the piezoelectric thin film.

An XRD pattern of the first electrode layer of each of Examples 20 and 21 and Comparative Example 4 was measured in the same manner as Example 1. In any cases of Examples 20 and 21 and Comparative Example 4, the (002) plane of the Pt crystal composing the first electrode layer was oriented in the normal direction of the surface of the first electrode layer, and the (200) plane of the Pt crystal was oriented in the in-plane direction of the surface of the first electrode layer.

A composition of the piezoelectric thin film of each of Examples 20 and 21 and Comparative Example 4 was analyzed in the same manner as Example 1. In any cases of Examples 20 and 21 and Comparative Example 4, the composition of the piezoelectric thin film approximately coincided with the composition of the target. The composition of the piezoelectric thin film (values of x, y and z each) of each of Examples 20 and 21 and Comparative Example 4 is shown in the following Table 2.

XRD patterns of the piezoelectric thin film of each of Examples 20 and 21 and Comparative Example 4 were measured in the same manner as Example 1. Any of the XRD patterns of Examples 20 and 21 and Comparative Example 4 indicated that the piezoelectric thin film is composed of a perovskite-type crystal.

In the case of Example 20, the (110) plane of the perovskite-type crystal was oriented in the normal direction of the surface of the piezoelectric thin film.

In the case of Example 21, the (111) plane of the perovskite-type crystal was oriented in the normal direction of the surface of the piezoelectric thin film.

In the case of Comparative Example 4, specific crystal plane of the perovskite-type crystal was not oriented in the normal direction of the surface of the piezoelectric thin film. In other words, in the case of Comparative Example 4, the orientation degree of any of the crystal planes was less than 50%.

Based on the XRD pattern, the orientation degree of the (110) plane of the perovskite-type crystal of Example 20 was calculated. The orientation degree of the (110) plane is represented by $100 \times I_{(110)}/\Sigma I_{(hkl)}$. The detail of the definition of the orientation degree is as described above. The orientation degree of the (110) plane of Example 20 is shown in the following Table 2.

Based on the XRD pattern, the orientation degree of the (111) plane of the perovskite-type crystal of Example 21 was calculated. The orientation degree of the (111) plane is represented by $100 \times I_{(111)}/\Sigma I_{(hkl)}$. The detail of the definition of the orientation degree is as described above. The orientation degree of the (111) plane of Example 21 is shown in the following Table 2.

A piezoelectric constant $d_{33,f}$ of the piezoelectric thin film of each of Examples 20 and 21 and Comparative Example 4 was measured in the same manner as Example 1. The piezoelectric constant $d_{33,f}$ of each of Examples 20 and 21 and Comparative Example 4 is shown in the following Table 2.

TABLE 2

| | Piezoelectric thin film | | | | | |
|---|---|---|---|---|---|---|
| | x | y | z | Oriented plane | Orientation degree [%] | $d_{33,f}$ |
| Example 9 | 0.250 | 0.250 | 0.500 | (001) plane | 99 | 110 |
| Example 20 | 0.250 | 0.250 | 0.500 | (110) plane | 83 | 76 |
| Example 21 | 0.250 | 0.250 | 0.500 | (111) plane | 95 | 85 |
| Comparative Example 4 | 0.250 | 0.250 | 0.500 | None | — | 37 |

Examples 22 and 23

In each case of Examples 22 and 23, a second intermediate layer was formed on the entire surface of the first electrode layer, and a piezoelectric thin film was formed on the entire surface of the second intermediate layer. The second intermediate layer of Example 22 consisted of crystalline $SrRuO_3$. The thickness of the second intermediate layer of Example 22 was 50 nm. The second intermediate layer of Example 23 consisted of crystalline $LaNiO_3$. The thickness of the second intermediate layer of Example 23 was 50 nm.

A piezoelectric thin film device of each of Examples 22 and 23 was made in the same manner as Example 9, except that the second intermediate layer was formed.

An XRD pattern of the first electrode layer of each of Examples 22 and 23 was measured in the same manner as Example 1. In any cases of Examples 22 and 23, the (002) plane of the Pt crystal composing the first electrode layer was oriented in the normal direction of the surface of the first electrode layer, and the (200) plane of the Pt crystal was oriented in the in-plane direction of the surface of the first electrode layer.

A composition of the piezoelectric thin film of each of Examples 22 and 23 was analyzed in the same manner as Example 1. In any cases of Examples 22 and 23, the composition of the piezoelectric thin film approximately coincided with the composition of the target. The composition of the piezoelectric thin film (values of x, y and z each) of each of Examples 22 and 23 is shown in the following Table 3.

XRD patterns of the piezoelectric thin film of each of Examples 22 and 23 were measured in the same manner as Example 1. Any of the XRD patterns of Examples 22 and 23 indicated that the piezoelectric thin film is composed a perovskite-type crystal. In any cases of Examples 22 and 23, the (001) plane of the perovskite-type crystal was oriented in the normal direction of the surface of the piezoelectric thin film. In any cases of Examples 22 and 23, the perovskite-type crystal contained in the piezoelectric thin film was a tetragonal crystal.

A piezoelectric constant $d_{33,f}$ of the piezoelectric thin film of each of Examples 22 and 23 was measured in the same manner as Example 1. The piezoelectric constant $d_{33,f}$ of each of Examples 22 and 23 is shown in the following Table 3.

TABLE 3

| | Piezoelectric thin film | | | | | Second | |
| --- | --- | --- | --- | --- | --- | --- | --- |
| | x | y | z | Oriented plane | Orientation degree [%] | intermediate layer | $d_{33,f}$ |
| Example 9 | 0.250 | 0.250 | 0.500 | (001) plane | 99 | Absent | 110 |
| Example 22 | 0.250 | 0.250 | 0.500 | (001) plane | 99 | SrRuO$_3$ | 106 |
| Example 23 | 0.250 | 0.250 | 0.500 | (001) plane | 99 | LaNiO$_3$ | 108 |

Examples 24 to 26

No first intermediate layer was formed in the step of making a piezoelectric thin film device of Example 24. A first electrode layer consisting of crystalline SrRuO$_3$ was directly formed on the entire surface of a single crystal substrate in the step of making the piezoelectric thin film device of Example 24. The thickness of the first electrode layer of Example 24 was 200 nm. The piezoelectric thin film device of Example 24 was made in the same manner as Example 9 except for these matters.

No first intermediate layer was formed in the step of making a piezoelectric thin film device of Example 25. A first electrode layer consisting of crystalline SrRuO$_3$ was directly formed on the entire surface of a single crystal substrate in the step of making a piezoelectric thin film device of Example 25. The thickness of the first electrode layer of Example 25 was 200 nm. The piezoelectric thin film device of Example 25 was made in the same manner as Example 20 except for these matters.

No first intermediate layer was formed in the step of making a piezoelectric thin film device of Example 26. A first electrode layer consisting of crystalline SrRuO$_3$ was directly formed on the entire surface of a single crystal substrate in the step of making a piezoelectric thin film device of Example 26. The thickness of the first electrode layer of Example 26 was 200 nm. The piezoelectric thin film device of Example 26 was made in the same manner as Example 21 except for these matters.

An XRD pattern of the first electrode layer of each of Examples 24 to 26 was measured in the same manner as Example 1. In any cases of Examples 24 to 26, the crystal plane of the first electrode layer was not oriented in the in-plane direction of the surface of the first electrode layer. In other words, in any cases of Examples 24 to 26, the in-plane orientation of the crystal of the first electrode layer was absent.

A composition of the piezoelectric thin film of each of Examples 24 to 26 was analyzed in the same manner as Example 1. In any cases of Examples 24 to 26, the composition of the piezoelectric thin film approximately coincided with the composition of the target. The composition of the piezoelectric thin film (values of x, y and z each) of each of Examples 24 to 26 is shown in the following Table 4.

XRD patterns of the piezoelectric thin film of each of Examples 24 to 26 were measured in the same manner as Example 1. Any of the XRD patterns of Examples 24 to 26 indicated that the piezoelectric thin film is composed of a perovskite-type crystal.

In the case of Example 24, the (001) plane of the perovskite-type crystal was oriented in the normal direction of the surface of the piezoelectric thin film. The orientation degree of the (001) plane of Example 24 is shown in the following Table 4.

In the case of Example 25, the (110) plane of the perovskite-type crystal was oriented in the normal direction of the surface of the piezoelectric thin film. The orientation degree of the (110) plane of Example 25 is shown in the following Table 4.

In the case of Example 26, the (111) plane of the perovskite-type crystal was oriented in the normal direction of the surface of the piezoelectric thin film. The orientation degree of the (111) plane of Example 26 is shown in the following Table 4.

A piezoelectric constant $d_{33,f}$ of the piezoelectric thin film of each of Examples 24 to 26 was measured in the same manner as Example 1. The piezoelectric constant $d_{33,f}$ of each of Examples 24 to 26 is shown in the following Table 4.

TABLE 4

| | Piezoelectric thin film | | | | | First electrode layer | |
|---|---|---|---|---|---|---|---|
| | x | y | z | Oriented plane | Orientation degree [%] | In-plane orientation | $d_{33,f}$ |
| Example 9 | 0.250 | 0.250 | 0.500 | (001) plane | 99 | Present | 110 |
| Example 20 | 0.250 | 0.250 | 0.500 | (110) plane | 85 | Present | 76 |
| Example 21 | 0.250 | 0.250 | 0.500 | (111) plane | 95 | Present | 85 |
| Example 24 | 0.250 | 0.250 | 0.500 | (001) plane | 91 | Absent | 98 |
| Example 25 | 0.250 | 0.250 | 0.500 | (110) plane | 81 | Absent | 72 |
| Example 26 | 0.250 | 0.250 | 0.500 | (111) plane | 89 | Absent | 81 |

Examples 27 to 29

In making of the target of Example 27, the compounding ratio of the raw material powder (bismuth oxide, potassium carbonate, titanium oxide, magnesium oxide, nickel oxide and iron oxide) was adjusted to correspond to the intended composition of the piezoelectric thin film. The intended composition of the piezoelectric thin film was represented by chemical formula 1B described below. In the chemical formula 1B, a value of each of x, y, z and γ was a value shown in the following Table 5.

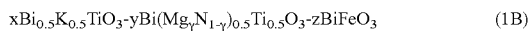

$xBi_{0.5}K_{0.5}TiO_3\text{-}yBi(Mg_\gamma N_{1-\gamma})_{0.5}Ti_{0.5}O_3\text{-}zBiFeO_3$  (1B)

A piezoelectric thin film device of Example 27 was made in the same manner as Example 1, except that the composition of the target used for forming the piezoelectric thin film was different.

In the case of Example 28, γ in the chemical formula 1B was ⅓. In the case of Example 29, γ in the chemical formula 1B was 0. In other words, in the case of Example 29, no magnesium oxide was used as raw material powder of the target. The piezoelectric thin film device of each of Examples 28 and 29 was made in the same manner as Examples 27 except for y.

An XRD pattern of the first electrode layer of each of Examples 27 to 29 was measured in the same manner as Example 1. In any cases of Examples 27 to 29, the (002) plane of the Pt crystal composing the first electrode layer was oriented in the normal direction of the surface of the first electrode layer, and the (200) plane of the Pt crystal was oriented in the in-plane direction of the surface of the first electrode layer.

A composition of the piezoelectric thin film of each of Examples 27 to 29 was analyzed in the same manner as Example 1. In any cases of Examples 27 to 29, the composition of the piezoelectric thin film approximately coincided with the composition of the target. The composition of the piezoelectric thin film of each of Examples 27 to 29 (values of x, y, z and γ each) are shown in the following Table 5.

XRD patterns of the piezoelectric thin film of each of Examples 27 to 29 were measured in the same manner as Example 1. Any of the XRD patterns of Examples 27 to 29 indicated that the piezoelectric thin film is composed of a perovskite-type crystal. In any cases of Examples 27 to 29, the (001) plane of the perovskite-type crystal was oriented in the normal direction of the surface of the piezoelectric thin film. In any cases of Examples 27 to 29, the perovskite-type crystal contained in the piezoelectric thin film was a tetragonal crystal. The orientation degree of the (001) plane of each of Examples 27 to 29 is shown in the following Table 5.

A piezoelectric constant $d_{33,f}$ of the piezoelectric thin film of each of Examples 27 to 29 was measured in the same manner as Example 1. The piezoelectric constant $d_{33,f}$ of each of Examples 27 to 29 is shown in the following Table 5.

TABLE 5

| | x | y | z | γ | Oriented plane | Orientation degree [%] | $d_{33,f}$ |
|---|---|---|---|---|---|---|---|
| Example 27 | 0.250 | 0.250 | 0.500 | 0.500 | (001) plane | 99 | 100 |
| Example 28 | 0.250 | 0.250 | 0.500 | ⅓ | (001) plane | 99 | 96 |
| Example 29 | 0.250 | 0.250 | 0.500 | 0.000 | (001) plane | 99 | 89 |

INDUSTRIAL APPLICABILITY

The piezoelectric thin film according to the present invention is applied, for example, to a piezoelectric actuator and a piezoelectric sensor.

REFERENCE SIGNS LIST

10, 40, 50 and 100: PIEZOELECTRIC THIN FILM DEVICE, 1: SINGLE CRYSTAL SUBSTRATE, 2: FIRST ELECTRODE LAYER, 3, 25, 30, 42 and 52: PIEZOELECTRIC THIN FILM, 4: SECOND ELECTRODE LAYER, 5: FIRST INTERMEDIATE LAYER, 6: SECOND INTERMEDIATE LAYER, $D_N$: NORMAL DIRECTION OF SURFACE OF SINGLE CRYSTAL SUBSTRATE, dn: NORMAL DIRECTION OF SURFACE OF PIEZOELECTRIC THIN FILM, uc: UNIT CELL OF PEROVSKITE STRUCTURE, a: DISTANCE BETWEEN (100) PLANES OF UNIT CELL, b: DISTANCE BETWEEN (010) PLANES OF UNIT CELL, c: DISTANCE BETWEEN (001) PLANES OF UNIT CELL, 200: HEAD ASSEMBLY, 9: BASE PLATE, 11: LOAD BEAM, 11*b*: BASE PART, 11*c*: FIRST LEAF SPRING PART, 11*d*: SECOND LEAF SPRING PART, 11*e*: APERTURE, 11*f*: BEAM MAIN PART, 15: FLEXIBLE SUBSTRATE, 17: FLEXURE, 19: HEAD SLIDER, 19*a*: HEAD DEVICE, 300: PIEZOELECTRIC ACTUATOR, 20: BASE, 21: PRESSURE CHAMBER, 23: INSULATING FILM, 24: SINGLE CRYSTAL SUBSTRATE, 26:

UPPER ELECTRODE LAYER (FIRST ELECTRODE LAYER), 27: NOZZLE, 400: GYRO SENSOR, 110: BASE, 120 and 130: ARM, 31: UPPER ELECTRODE LAYER (FIRST ELECTRODE LAYER), 31a and 31b: DRIVE ELECTRODE LAYER, 31c and 31d: DETECTION ELECTRODE LAYER, 32: SINGLE CRYSTAL SUBSTRATE, 500: PRESSURE SENSOR, 41: COMMON ELECTRODE LAYER, 43: INDIVIDUAL ELECTRODE LAYER, 44: SUPPORT, 45: CAVITY, 46: CURRENT AMPLIFIER, 47: VOLTMETER, 600: PULSE WAVE SENSOR, 51: COMMON ELECTRODE LAYER, 53: INDIVIDUAL ELECTRODE LAYER, 54: SUPPORT, 55: VOLTMETER, 700: HARD DISK DRIVE, 60: HOUSING, 61: HARD DISK, 62: HEAD STACK ASSEMBLY, 63: VOICE COIL MOTOR, 64: ACTUATOR ARM, 65: HEAD ASSEMBLY, 800: INK JET PRINTER DEVICE, 70: PRINTER HEAD, 71: MAIN BODY, 72: TRAY, 73: HEAD DRIVE MECHANISM, 74: OUTLET, 75: RECORDING SHEET, 76: AUTO SHEET FEEDER (AUTOMATIC CONTINUOUS PAPER FEED MECHANISM).

What is claimed is:

1. A piezoelectric thin film containing a metal oxide,
    wherein the metal oxide contains bismuth, potassium, titanium, iron and element M;
    the element M is at least one of magnesium and nickel;
    at least a part of the metal oxide is a tetragonal crystal having a perovskite structure; and
    a (001) plane of the tetragonal crystal is oriented in a normal direction of a surface of the piezoelectric thin film;
    wherein the metal oxide is represented by the following chemical formula 1:

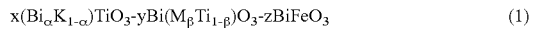

$$x(Bi_\alpha K_{1-\alpha})TiO_3\text{-}yBi(M_\beta Ti_{1-\beta})O_3\text{-}zBiFeO_3 \quad (1)$$

wherein each of x, y and z in the chemical formula 1 is a positive real number;
x+y+z is 1;
α in the chemical formula 1 is more than 0 and less than 1;
β in the chemical formula 1 is more than 0 and less than 1;
M in the chemical formula 1 is represented by $Mg_\gamma Ni_{1-\gamma}$; and
γ is 0 or more and 1 or less;
wherein a three-dimensional coordinate system is composed of an X-axis, a Y-axis and a Z-axis:
any coordinates in the coordinate system are represented by (X, Y, Z);
coordinates (x, y, z) in the coordinate system correspond to x, y and z in the chemical formula 1;
coordinates A in the coordinate system are (0.300, 0.100, 0.600),
coordinates B in the coordinate system are (0.450, 0.250, 0.300),
coordinates C in the coordinate system are (0.200, 0.500, 0.300),
coordinates D in the coordinate system are (0.100, 0.300, 0.600),
a triangle coordinate system is a triangle with vertexes at coordinates (1, 0, 0), coordinates (0, 1, 0), and coordinates (0, 0, 1),
X+Y+Z is 1 in the triangle coordinate system,
the coordinates (x, y, z), the coordinates A, the coordinates B, the coordinates C, the coordinates D are positioned within the triangle coordinate system, and
the coordinates (x, y, z) corresponding to x, y and z in the chemical formula 1 are positioned within a quadrangle with vertexes at the coordinates A, the coordinates B, the coordinates C, and the coordinates D.

2. The piezoelectric thin film according to claim 1,
    wherein coordinates E in the coordinate system are (0.400, 0.200, 0.400),
    coordinates F in the coordinate system are (0.200, 0.400, 0.400),
    the coordinates E and the coordinates F are positioned within the triangle coordinate system, and
    the coordinates (x, y, z) corresponding to x, y and z in the chemical formula 1 are positioned within a quadrangle with vertexes at the coordinates A, the coordinates E, the coordinates F, and the coordinates D.

3. The piezoelectric thin film according to claim 1, wherein the piezoelectric thin film is an epitaxial film.

4. The piezoelectric thin film according to claim 1, wherein the piezoelectric thin film is a ferroelectric thin film.

5. A piezoelectric thin film device comprising:
    the piezoelectric thin film according to claim 1.

6. The piezoelectric thin film device according to claim 5 comprising:
    a single crystal substrate; and
    the piezoelectric thin film stacked on the single crystal substrate.

7. The piezoelectric thin film device according to claim 5 comprising:
    a single crystal substrate;
    an electrode layer stacked on the single crystal substrate; and
    the piezoelectric thin film stacked on the electrode layer.

8. The piezoelectric thin film device according to claim 5 comprising:
    an electrode layer; and
    the piezoelectric thin film stacked on the electrode layer.

9. The piezoelectric thin film device according to claim 7 further comprising:
    at least one intermediate layer,
    wherein the intermediate layer is disposed between the single crystal substrate and the electrode layer.

10. The piezoelectric thin film device according to claim 8 further comprising:
    at least one intermediate layer,
    wherein the intermediate layer is disposed between the electrode layer and the piezoelectric thin film.

11. The piezoelectric thin film device according to claim 7,
    wherein the electrode layer contains a platinum crystal,
    a (002) plane of the platinum crystal is oriented in a normal direction of a surface of the electrode layer, and
    a (200) plane of the platinum crystal is oriented in an in-plane direction of the surface of the electrode layer.

12. A piezoelectric actuator comprising:
    the piezoelectric thin film device according to claim 5.

13. A piezoelectric sensor comprising:
    the piezoelectric thin film device according to claim 5.

14. A piezoelectric transducer comprising:
    the piezoelectric thin film device according to claim 5.

15. A hard disk drive comprising a head stack assembly,
    wherein the head stack assembly comprises a head assembly, and
    the head assembly comprises the piezoelectric actuator according to claim 12.

16. A printer head comprising:
the piezoelectric actuator according to claim 12.

17. An ink jet printer device comprising:
the printer head according to claim 16.

* * * * *